United States Patent
Mielczarek et al.

(10) Patent No.: US 8,665,979 B2
(45) Date of Patent: Mar. 4, 2014

(54) QUANTIZED CHANNEL STATE INFORMATION PREDICTION IN MULTIPLE ANTENNA SYSTEMS

(75) Inventors: Bartosz Mielczarek, Edmonton (CA); Witold Krzymien, Edmonton (CA)

(73) Assignee: Wi-LAN, Inc., Ottawa, Ontario (CA)

( * ) Notice: Subject to any disclaimer, the term of this patent is extended or adjusted under 35 U.S.C. 154(b) by 0 days.

(21) Appl. No.: 13/190,354

(22) Filed: Jul. 25, 2011

(65) Prior Publication Data

US 2011/0280324 A1 Nov. 17, 2011

Related U.S. Application Data

(62) Division of application No. 11/852,206, filed on Sep. 7, 2007, now Pat. No. 8,009,778.

(51) Int. Cl.
*H04L 1/02* (2006.01)
*H04B 7/02* (2006.01)

(52) U.S. Cl.
USPC ........... 375/267; 375/299; 375/347; 370/334; 455/101

(58) Field of Classification Search
USPC .................. 375/267, 299, 347, 295; 370/334; 455/101
See application file for complete search history.

(56) References Cited

U.S. PATENT DOCUMENTS

| | | | |
|---|---|---|---|
| 5,706,312 | A | 1/1998 | Wei |
| 5,790,676 | A | 8/1998 | Ganesan |
| 7,333,556 | B2 | 2/2008 | Maltsev |
| 7,570,627 | B2 | 8/2009 | Welborn |
| 7,599,714 | B2 | 10/2009 | Kuzminskiy |
| 7,702,029 | B2 | 4/2010 | Kotecha |
| 2003/0012290 | A1 | 1/2003 | Fimoff |
| 2003/0017835 | A1* | 1/2003 | Bergel ........................ 455/502 |
| 2003/0144032 | A1 | 7/2003 | Brunner |
| 2004/0057394 | A1 | 3/2004 | Holtzman |
| 2004/0190636 | A1 | 9/2004 | Oprea |
| 2004/0259555 | A1 | 12/2004 | Rappaport |
| 2005/0195912 | A1 | 9/2005 | Kim |

(Continued)

FOREIGN PATENT DOCUMENTS

| | | |
|---|---|---|
| CA | 2 548 919 A1 | 6/2005 |
| WO | 2005/081439 A1 | 9/2005 |
| WO | 2005/125044 A1 | 12/2005 |
| WO | 2007/066936 A2 | 6/2007 |

OTHER PUBLICATIONS

Jindal, N., "MIMO Broadcast Channels With Digital Channel Feedback," 40th Asilomar Conference on Signals, Systems and Computers (ACSSC '06), Pacific Grove, Calif., Oct. 29-Nov. 1, 2006, pp. 1506-1510.

(Continued)

*Primary Examiner* — Ted Wang
(74) *Attorney, Agent, or Firm* — Volpe and Koenig, P.C.

(57) ABSTRACT

A CSI vector quantizer (VQ) system is provided for time-correlated channels. The VQ system operates a receiver forwarding quantized channel state information in the form of indices and a transmitter predicting channel state change. The VQ system is aimed at feedback channels, in which bit errors, erasures and delays can occur. The VQ system uses transmitter-side channel prediction algorithms that work with the quantized CSI information and allow the system to recover from feedback channel transmission errors, erasures and delays. Moreover, the techniques can be used to lower the required feedback rate, while keeping the system's throughput at the required level.

16 Claims, 16 Drawing Sheets

(56) References Cited

U.S. PATENT DOCUMENTS

| | | |
|---|---|---|
| 2005/0259764 A1 | 11/2005 | Hung Lai |
| 2006/0008021 A1 | 1/2006 | Bonnet |
| 2006/0039489 A1 | 2/2006 | Ikram |
| 2006/0111148 A1 | 5/2006 | Mukkavilli |
| 2006/0155534 A1 | 7/2006 | Lin |
| 2006/0165008 A1 | 7/2006 | Li |
| 2006/0215780 A1 | 9/2006 | Yeon |
| 2006/0268623 A1 | 11/2006 | Chae |
| 2007/0120670 A1 | 5/2007 | Torchalski |
| 2007/0153731 A1 | 7/2007 | Fine |
| 2008/0080449 A1 | 4/2008 | Huang |
| 2008/0080459 A1 | 4/2008 | Kotecha |
| 2008/0084943 A1 | 4/2008 | Jung |
| 2008/0219369 A1 | 9/2008 | Wu |
| 2008/0232274 A1 | 9/2008 | Grover |
| 2008/0268862 A1 | 10/2008 | Kent |
| 2008/0285670 A1 | 11/2008 | Walton |
| 2009/0067512 A1 | 3/2009 | Mielczarek |
| 2009/0067529 A1 | 3/2009 | Mielczarek |
| 2009/0201861 A1 | 8/2009 | Kotecha |
| 2009/0265601 A1 | 10/2009 | Mielczarek |
| 2009/0274230 A1 | 11/2009 | Heath, Jr. |
| 2010/0046666 A1 | 2/2010 | Ketchum |
| 2010/0150036 A1 | 6/2010 | Zheng |
| 2010/0266054 A1 | 10/2010 | Mielczarek |
| 2010/0322336 A1 | 12/2010 | Nabar |
| 2012/0057643 A1 | 3/2012 | Lin |

OTHER PUBLICATIONS

Mielczarek, B., and W. Krzymień, "Flexible Channel Feedback Quantization in Multiple Antenna Systems," IEEE 61st Semiannual Vehicular Technology Conference (VTC 2005—Spring), Stockholm, May 30-Jun. 1, 2005, pp. 620-624.

Mielczarek, B., and W. Krzymień, "Vector Quantization of Channel Information in Linear Multi-User MIMO Systems," IEEE 9th International Symposium on Spread Spectrum Techniques and Applications, Manaus-Amazon, Brazil, Aug. 28-31, 2006, pp. 302-306.

Mielczarek, B., and W. Krzymień, "Influence of CSI Feedback Delay on Capacity of Linear Multi-User MIMO Systems," IEEE Wireless Communications and Networking Conference (WCNC 2007), Hong Kong, Mar. 11-15, 2007, pp. 1189-1193.

Mielczarek, B., and W. Krzymień, "Influence of CSI Feedback Errors on Capacity of Linear Multi-User MIMO Systems," 2007 IEEE 65th Vehicular Technology Conference (VTC2007—Spring), Dublin, Ireland, Apr. 22-25, 2007, pp. 2043-2047.

Mielczarek, B., "Quantized CSI Prediction in Linear Multi-User MIMO Systems," 2008 IEEE 67th Vehicular Technology Conference (VTC2008—Spring), Singapore, May 11-14, 2008, pp. 852-857.

Ravindran, N., and N. Jindal, "MIMO Broadcast Channels with Block Diagonalization and Finite Rate Feedback," Computing Research Repository—CORR, arXiv:cs/0610077v1, Oct. 2006, 4 pages.

Roh, J.C., and B.D. Rao, "Channel Feedback Quantization Methods for MISO and MIMO Systems," 2004 IEEE 15th International Symposium on Personal, Indoor and Mobile Radio Communications, Barcelona, Sep. 5-8, 2004, vol. 2, pp. 805-809.

Sadrabadi, M.A., et al., "A New Method of Channel Feedback Quantization for High Data Rate MIMO Systems," 47th Annual IEEE Global Telecommunications Conference (GLOBECOM '04), Dallas, Nov. 29-Dec. 3, 2004, pp. 91-95.

Balachandran, K., et al., "Channel Quality Estimation and Rate Adaptation for Cellular Mobile Radio," IEEE Journal on Selected Areas in Communication 17(7):1244-1256, Jul. 1999.

Bulumulla, S.B., et al., "A Systemic Approach to Detecting OFDM Signals in a Fading Channel," IEEE Transactions on Communications 48(5):725-728, May 2000.

Caire, G., et al., "Multiuser MIMO Achievable Rates With Downlink Training and Channel State Feedback," IEEE Transactions on Information Theory 56(6):2845-2866, Jun. 2010.

Raghavan, V., et al., "Systematic Codebook Designs for Quantized Beamforming in Correlated MIMO Channels," IEEE Journal on Selected Areas in Communication 25(7):1298-1310, Sep. 2007.

Sadrabadi, M.A., et al., "A New Method of Channel Feedback Quantization for High Data Rate MIMO Systems," IEEE Global Telecommunications Conference (Globecom 2004), Dallas, Nov. 3-Dec. 3, 2004, vol. 1, pp. 91-95.

Zorzi, M., and R.R. Rao, "Lateness Probability of a Retransmission Scheme for Error Control on a Two-State Markov Channel," IEEE Transactions on Communications 47(10):1537-1548, Oct. 1999.

\* cited by examiner

*Slow changing channel*

*Fast changing channel*

*Slow channel phrases*: 6315, 4325, ....
*Fast channel phrases*: _3_5, _3_5, ....

*Transmitter with partial predictors*

*Transmitter with a composite predictor*

QUANTIZED CHANNEL STATE INFORMATION PREDICTION IN MULTIPLE ANTENNA SYSTEMS

BACKGROUND

One of the most promising solutions for increased spectral efficiency in high capacity wireless systems is the use of multiple antennas on fading channels. The fundamental issue in such systems is the availability of the channel state information (CSI) at transmitters and receivers. In general, if the receivers and transmitter have an access to CSI, the system throughput can be significantly increased. While it is usually assumed that perfect CSI is available at the receivers, the transmitter may only have partial CSI available due to the feedback delay and noise, channel estimation errors and limited feedback bandwidth, which forces CSI to be quantized at the receiver to minimize feedback rate.

SUMMARY

A CSI vector quantizer (VQ) system is provided for time-correlated channels. The VQ system operates a receiver forwarding quantized channel state information in the form of indices and a transmitter predicting channel state change. The VQ system is aimed at feedback channels, in which bit errors, erasures and delays can occur. The VQ system uses transmitter-side channel prediction algorithms that work with the quantized CSI information and allow the system to recover from feedback channel transmission errors, erasures and delays. Moreover, the techniques can be used to lower the required feedback rate, while keeping the system's throughput at the required level. In one embodiment, a transmitter in a multiple antenna system predicts (extrapolates) the correct channel information index using past indices. In some embodiments, additional information may be recovered from the current erroneous index if not too many bit errors occurred. In other embodiments, a transmitter only uses indices received in the past.

In one embodiment, a prediction algorithm may consider multiple past values, or the frequency of past values of channel indices. The prediction algorithm may be a partial, composite or hybrid of partial and composite algorithms. The algorithms may also be static (off-line) or adaptive (on-line) versions of the above algorithms. The operation of the prediction algorithm may be adjusted for different rates of channel change. Multiple antenna systems are also provided that operate with one or more of the prediction algorithms to recover from feedback channel delays, erasures and errors. The system may operate using any combination of the prediction algorithms.

BRIEF DESCRIPTION OF THE FIGURES

Embodiments will now be described with reference to the figures, in which like reference characters denote like elements, by way of example, and in which.

DETAILED DESCRIPTION

Figure 1:
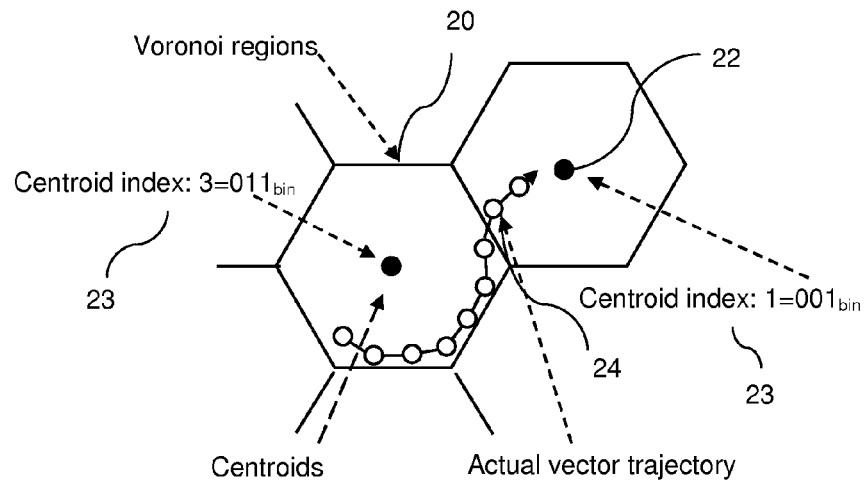
FIG. 1 is an illustration of how a typical CSI vector quantizer works.
Figure 5:
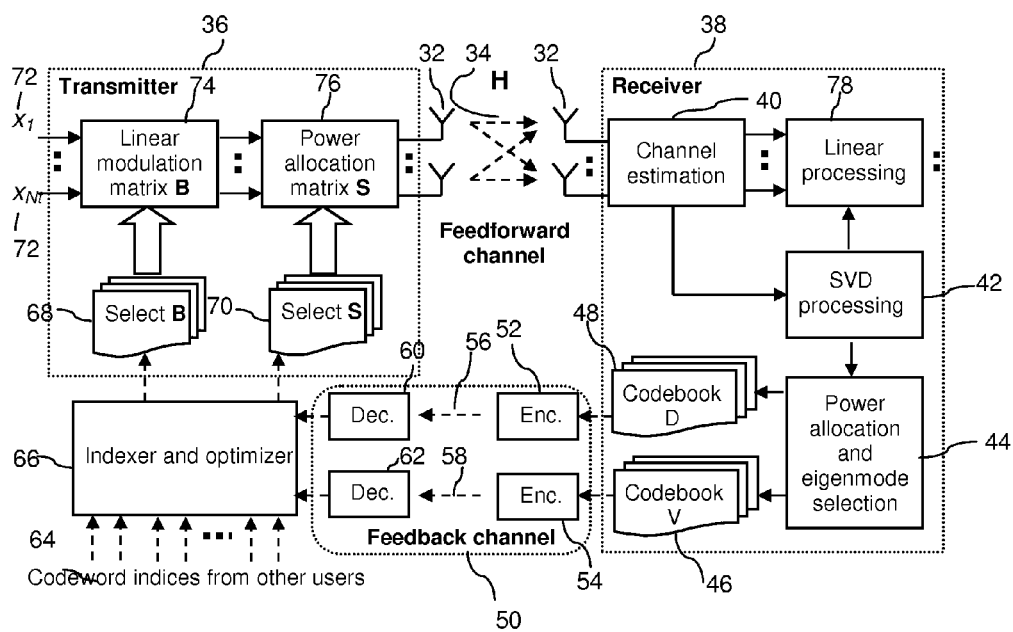
FIG. 5 shows the structure of an example of a quantization system.

In a multiple antenna system as for example shown in FIG. 5, information is transmitted over multiple channels 34 corresponding to multiple antennas 32. Each channel 34 has a state that affects the propagation of information over the channel. The state of multiple channels 34 between a transmitter 36 and one or more receivers 38 in a multiple antenna system can be expressed as a vector. As the channel state changes, this vector moves through the channel vector space. The channel vector space may be separated into regions. Each region may be represented by an index. If each region corresponds to the part of the space closest, by some metric, to a particular member of a set of points in the space, then the regions are known as Voronoi regions 20 and the points are known as centroids 22. In order to maximize throughput, it is preferred to associate each index to a centroid 22, which represents the Voronoi region 20 which is the part of space closer to that centroid 22 than any other. In the typical CSI vector quantizer, the quantization of the channel vector space is performed as shown in FIG. 1. The CSI space is tessellated by Voronoi regions 20 with corresponding centroids 22 that represent all vector realizations within each Voronoi region 20. The number of such regions 20 (centroids 22) is defined by the number of available bits and each centroid 22 is assigned an index with the binary representation of length equal to the number of available feedback bits. When the receiver transmits its channel state information to the transmitter, it is the bits representing the centroid indices 23 that are physically sent over the feedback channel.

Figure 2:
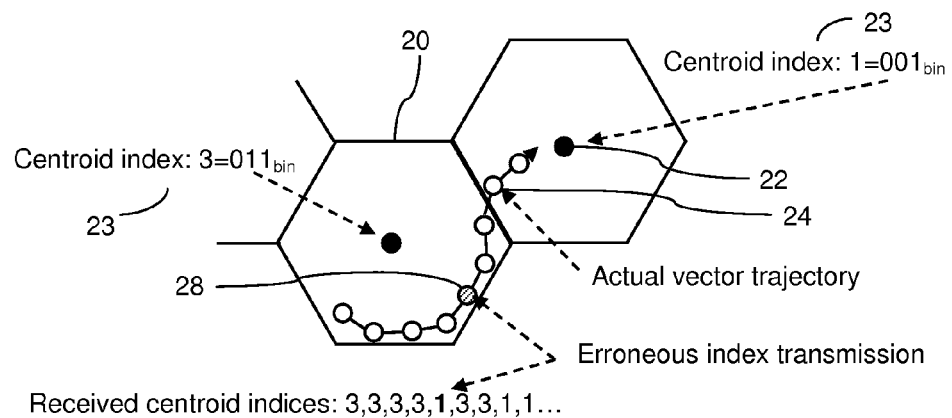
FIG. 2 shows an example of a transmission error in the environment of FIG. 1.

The typical problems that arise from imperfect feedback channel are transmission errors, erasures and delays. Example of the first problem is shown in FIG. 2, where one bit transmission error causes a transmitter 36 to obtain wrong index 28 of the channel information vector. Instead of the correct sequence of 3,3,3,3,3,3,3,1,1 ..., one bit error in the second position of the index causes the index to be changed from 3 to 1, resulting in the sequence 3,3,3,3,1,3,3,1,1 ....

Figure 3:
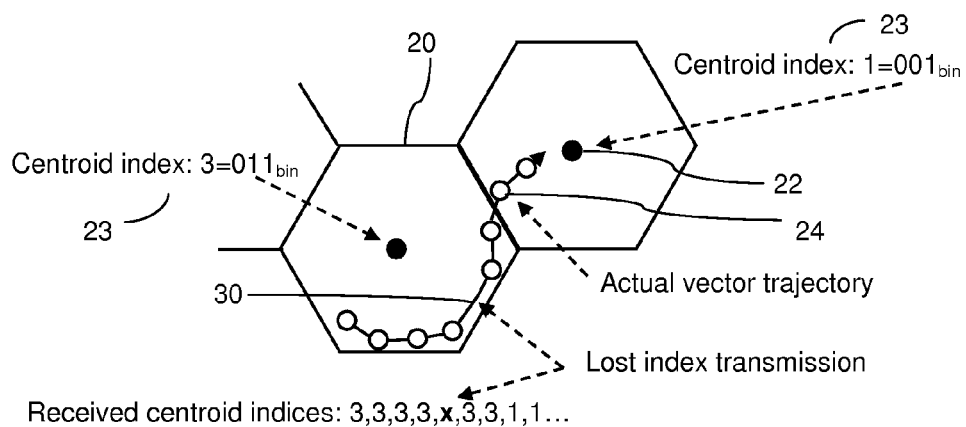
FIG. 3 shows an example of a transmission erasure in the environment of FIG. 1.

Example of the erasure problem is shown in FIG. 3, where one of the vector quantization indices has been lost and the transmitter 36 cannot obtain proper information about the channel state at the receiver 38. In such a situation, the transmitter 36 may not be able to decide the best way to transmit data to the receiver 38 whose index was lost. Note that this is equivalent to a situation where the transmitter 36 expurgates the users, whose indices have been deemed erroneous by error detection codes.

Figure 4:
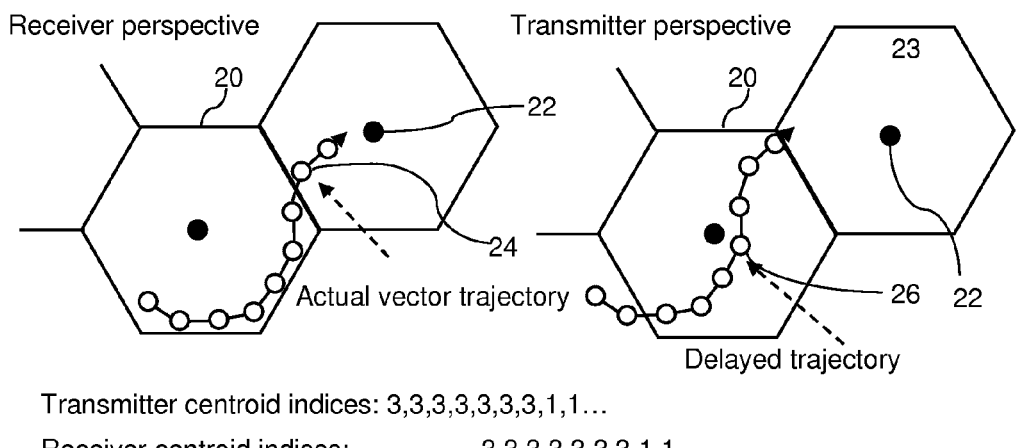
FIG. 4 shows an example of the effect of a feedback delay.

Example of the feedback delay problem is shown in FIG. 4, where a delay 26 of 2 transmission epochs is present when transmitting the indices from the receiver 38 to the transmitter 36. The result of such a situation is that the transmitter 36 will always use slightly outdated information about the channel state when optimizing the transmission to the receivers 38. This will lead to problems during transitions between adjacent Voronoi regions 20 when the transmitter 36 will use the centroids 22 that are no longer optimum for the receiver 38.

In all above cases, the transmitter 36 loses the ability to obtain the correct channel vector index sent by the mobile user 38. However, if the channel 34 is time-correlated, the information about the past channel information indices may be used to either correct the erroneous and erased indices 28, 30 and/or estimate the current indices if the feedback transmission channel introduces latency.

An algorithm is proposed in which a transmitter 36 predicts (extrapolates) the correct channel information index using past indices. In case of erroneous feedback transmission, some additional information may be recovered from the current erroneous index if not too many bit errors occurred. However, in case of the erasure and/or delays, the only information that a transmitter 36 may use is the indices received in the past.

A system using a dual VQ codebook design for quantization of channel state information in a multiple antenna system is shown in FIG. 5. This example shows a system according to the inventors' U.S. patent application Ser. No. 11/754,965 filed May 29, 2007. A multi-tiered VQ may be used for eigenmode and singular value codebooks in systems ranging from only one active receiver at a time to systems with multiple receivers being active simultaneously (where we define being active as receiving transmissions). The design of the multi-tiered codebooks can be applied to matrices of orthogonal eigenmodes, subsets of eigenmodes and scalar singular values as necessary. The following descriptions may be applied to any type of CSI quantizing solution. In FIG. 4, a transmitter 36 communicates with a receiver 38 over a feed-forward channel 34 and a feedback channel 50 using antennas 32. The receiver 38 includes a channel estimator 40, linear processor 78 for decoding a transmission, a singular value processing unit 42, a power allocation and eigenmode selector 44, and codebooks 48 and 46. Each of the transmitter 36 and the receiver 38 may use various known electronic processors for their parts, and in one embodiment may each use monolithic application specific chips. The functions of the transmitter 36 and receiver 38 may be provided partly or entirely by hardware, firmware and/or software. The transmitter 36 includes an indexer and optimizer 66 and stored modulation and power allocation matrices 68 and 70 respectively. An input data stream 72 is fed to a modulator 74 that applies a linear modulation matrix selected from the stored modulation matrices 68. The modulated data stream is fed to a power allocator 76, which applies a power allocation matrix selected from the stored power allocation matrices 70.

Prediction algorithms can be used for both eigenmode 46 and singular value 48 codebooks in systems ranging from only one active receiver 38 at a time to systems with multiple receivers 38 being active simultaneously (where we define being active as receiving transmissions). The design of multi-tiered codebooks can be applied to matrices of orthogonal eigenmodes, subsets of eigenmodes and scalar singular values as necessary. The following descriptions may be applied to any type of CSI quantizing solution.

The system of FIG. 5 works in one embodiment as follows:
1. Before the transmission epoch, each receiver 38 estimates 40 its channel matrix H and uses this information to perform 42 the singular value decomposition (SVD) of the matrix.
2. The eigenmode and singular value components are separately quantized 44 using two codebooks V 46 and D 48, respectively.
3. The indices of the selected codewords are fed back to the transmitter 36.
4. The transmitter 36 uses all the indices 64 from all receivers 38 in the system to choose 68, 70 the pre-computed linear modulation and power allocation matrices B and S, respectively. The choice is based on a predefined set of scheduling rules (maximum throughput, proportional fairness, etc.).
5. The signal 72 is modulated using the selected linear modulation 74 and power allocation 76 matrices B and S.
6. The received modulated signal is processed 78 by the receiver 38.

Figure 6:
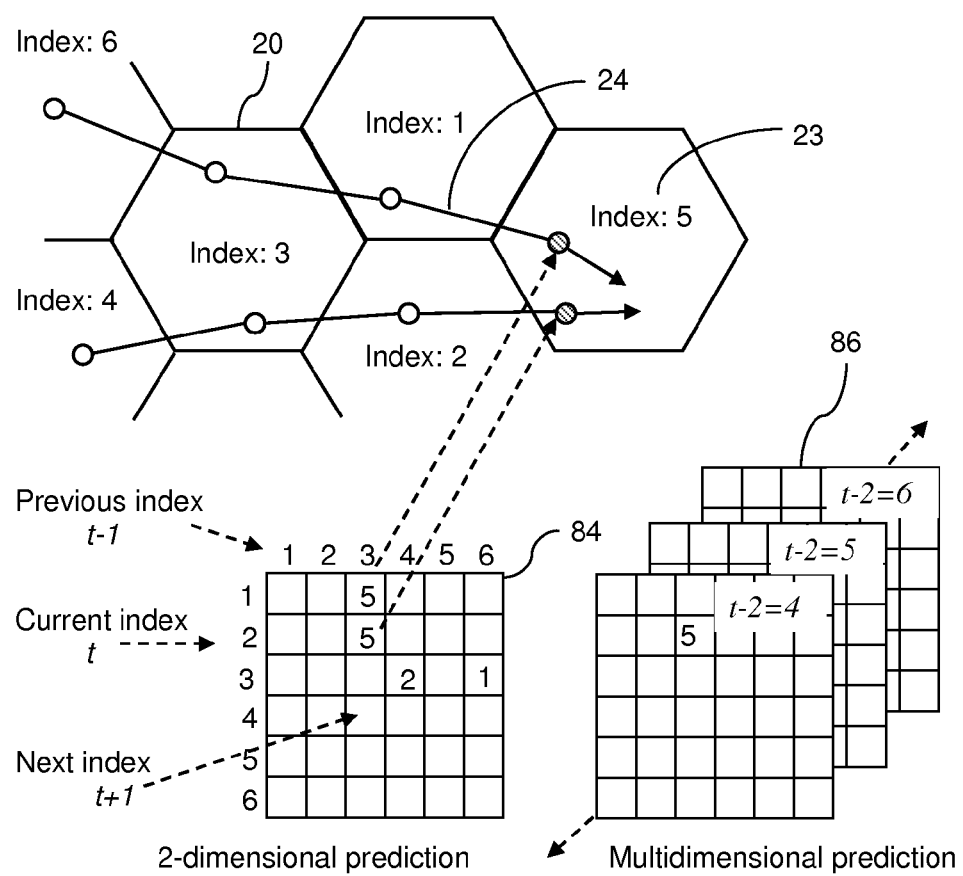
FIG. 6 shows an example of a prediction of channel states using matrices.

The design of a basic predictor for CSI vector quantizers may be based on a set of matrices containing statistical information about the channel behavior together with the given vector quantizer. The channel prediction matrices P will have a form of a 2-dimensional matrix in the simplest case to multi-dimensional matrix for more complicated solutions. FIG. 6 shows the basic principle of the channel prediction matrices using an example of typical CSI index trajectories 24 traversing a set of Voronoi regions 20. For a given channel coherence time and transmission epoch, the index trajectories will follow a certain path, which can be statistically characterized using prediction matrices. The basic channel prediction problem is to select the most probable future value of the vector quantizer index Δ transmission epochs from the current one as $$I[t+\Delta]=f(I[t],I[t-1],I[t-2]\ldots)$$

based on the current and past values of indices I. The left matrix 84 in FIG. 6 shows a case of Δ=1, where only the current t and previous t−1 value of the index I are used to select the most probable next index I[t+1]. For example, if the current index is equal to 2 and the previous one was 3, the most probable next one will be equal to 5. A similar approach can be extended to a multidimensional prediction problem where more past values of indices are used to predict the future ones. This is shown by a stack of matrices 86 on the right side of FIG. 6.

Figure 7:
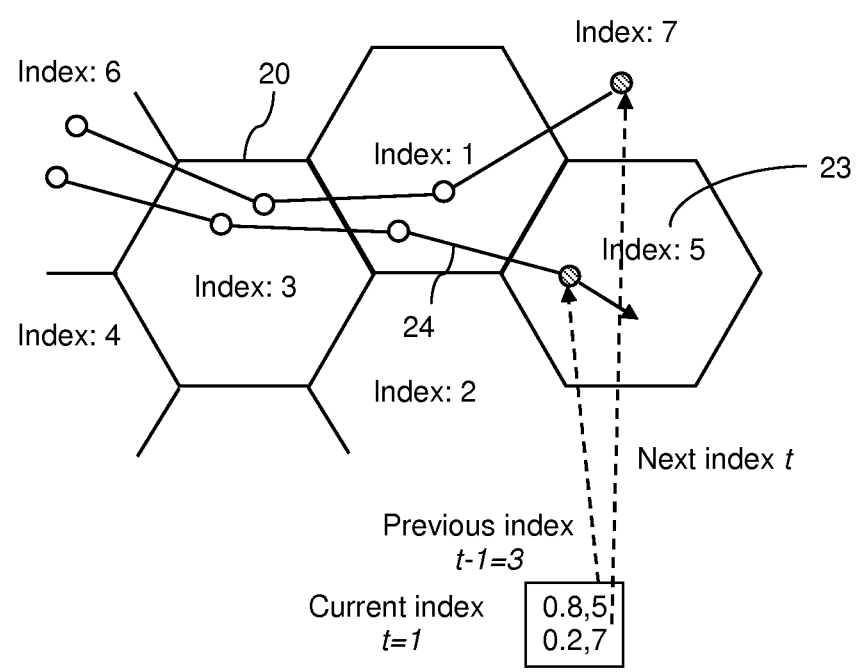
FIG. 7 shows an example of two channel state paths starting with identical indices and then diverging.

In practice, more than one future index may be possible for the same combination of current and past indices. FIG. 7 shows an example of two trajectories 24 that start identically but diverge later, resulting in the different prediction of the following index. In general, the higher the rate of change of the channel, the more unpredictable the future indices become and the number of future indices corresponding to the same set of previous indices increases.

It is possible to reflect this fact by enhancing the basic algorithm and storing all possible predicted indices together with their frequencies. In FIG. 7, one can see that two trajectories 24 going through the indices 6,3,1 were considered, the more probable resulting in index 5, and the less probable resulting in index 7. Both values are stored in the table, together with their frequencies (0.8 for index 5 and 0.2 for index 7). The system using the extended algorithm may now choose between different possible outcomes for the future index, for example (as shown later) by choosing the one closest to the erroneously received index 28.

Similarly to the previous algorithm, it is possible to enhance this algorithm by using more dimensions and calculating the relative frequencies for longer index tuples of I[t], I[t−1], I[t−2] . . . .

In practice, extending the prediction algorithm to more than 2-dimensions may be difficult due to the large memory requirements of the prediction matrices. For example, for 8-bit indices, the basic 2-dimensional prediction matrix will require 256×256=65,536 entries. Adding one more dimension to the predictor would make the number of entries grow to 256×65,536=16,777,216.

If higher dimensions of the prediction algorithm are to be used, another technique of constructing the prediction tables can be implemented, which is based on relative sparsity of the prediction matrices. For many rates of change of the channel 34, a lot of entries in the prediction matrices will not be used at all (they will contain null values) as there will be no physical possibility of a direct transition from certain centroids 22 to other ones for a given frame duration and channel coherence time. This fact can be used to construct sequences of valid indices, called henceforth phrases, that are used by the prediction algorithm to identify valid CSI transitions and select values of the index I[t+Δ]. In this embodiment, the predictor design will work as follows.

1. For each entry Z in the prediction matrix P containing more than 1 value (see the enhanced algorithm), create initial phrases as: $XYZ_1, XYZ_2, XYZ_3$ . . . where X=I[t−1], Y=I[t] and $Z_1, Z_2, Z_3$=I[t+Δ] for all relative frequencies not equal to 0.
2. For each phrase $XYZ_1, XYZ_2, XYZ_3$, step back in time and use search for entries V=I[t−2] that correspond to different entries $Z_1, Z_2, Z_3$ . . . . For example $V_1XYZ_1, V_2XYZ_1, V_3XYZ_2$ etc.
3. If required, continue the process of extending the phrases by adding next level U=I[t−3] and further levels.
4. For any phrase . . . UVXYZ, the extension process stops when:
   a) There is only one value of the index at the next phrase extension level that matches the given phrase, or:
   b) The phrase length reaches a designer imposed threshold, or:
   c) Any other design condition is met.

At the completion of the above algorithm, the predictor will contain a dictionary of phrases, corresponding to all allowed index sequences for a given quantizer structure and channel 34 characteristics. During the normal operation, the predictor will then be able to match the received indices with the stored phrases and use that knowledge to predict the next index. The salient advantage of this approach is the dramatically reduced look-up table storage requirement since only the actual transition phrases will have to be stored.

Moreover, it is possible to time-scale the phrases, depending on the rate of change of the channel 34, thus creating a universal predictor structure as shown in FIG. 8.

Figure 8A:
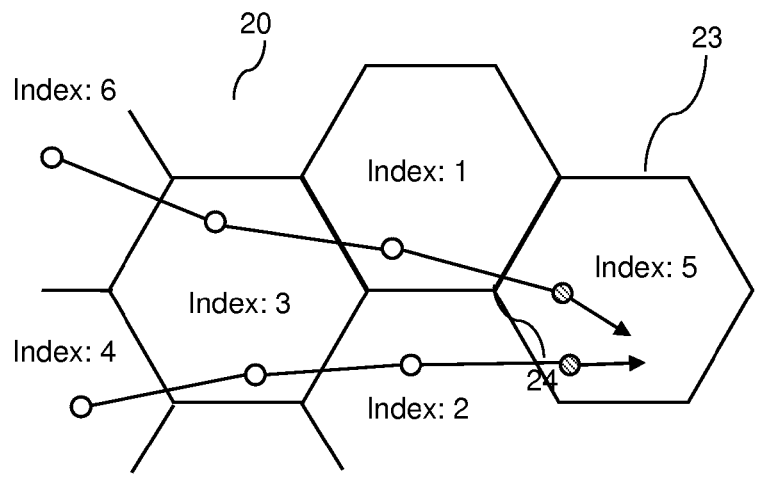
FIG. 8A shows a channel state path for a slow changing channel.
Figure 8B:
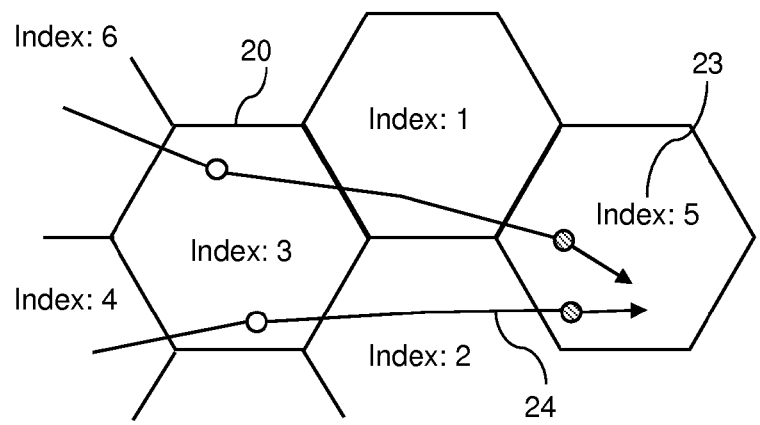
FIG. 8B shows a channel state path as in FIG. 8A, modified to adapt to a faster rate of channel change.

In FIGS. 8A and 8B, one can see two cases of a system, in which the normalized Doppler frequency increases. If the transmitter 36 has a dictionary of phrases for a slow channel 34 (FIG. 8A), it can resample them by choosing every second symbol (for example) in order to adapt them to the faster changing CSI indices as shown in FIG. 8B.

In general, using the phrase approach, one can create a general dictionary of phrases for the slowest changing channel 34 and reuse them by down-sampling them accordingly to the current rate of CSI index changes.

Figure 9A:
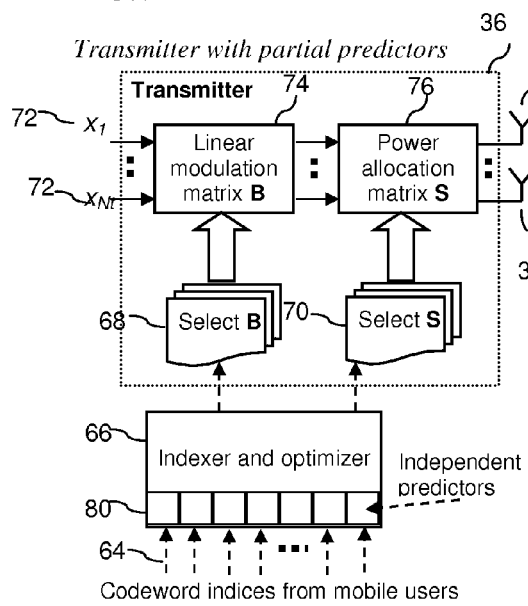
FIG. 9A shows a transmitter configuration for partial predictors.
Figure 9B:
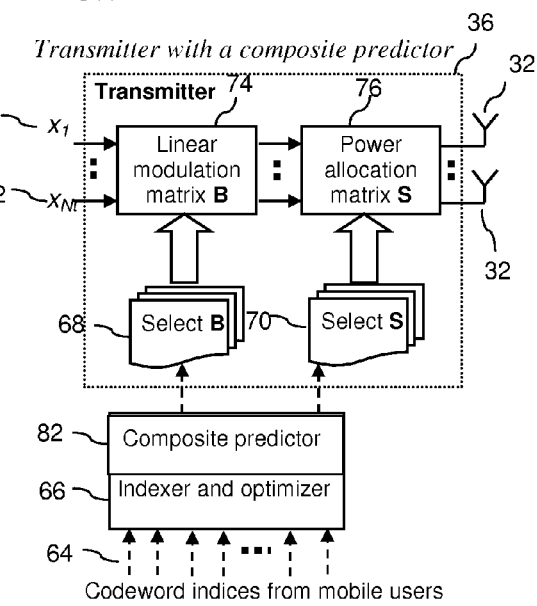
FIG. 9B shows a transmitter configuration for composite predictors.

Besides the basic and enhanced predictors described above, partial, composite and hybrid predictors are possible. The basic and enhanced prediction algorithms work on the sets of indices and are independent of the actual physical interpretation of those indices. Hence, based on the architecture in FIG. 5, it is possible to implement an exemplary prediction algorithm in three variants:

1. Partial predictors—prediction of the indices 23 representing the centroids 22 from separate users 38. In this case, the predictor algorithms can be used independently 80 on all indices 64 reported by mobile users 38 in the system. Based on the individually produced predictions, the indexer 66 optimizes the choice of active users 38 and selects the modulation 68 and power allocation 70 matrices accordingly (see FIG. 9A). The advantage of this approach is that it makes the system less vulnerable to erroneous predictions for some of the users 38. The disadvantage lies in introducing more hardware complexity as the separate predictions must be made for all the users 38.
2. Composite predictor—prediction of the indices representing the actual modulation matrices. In this case, the algorithm is used to predict the indices of modulation matrices serving a group of users 38 simultaneously. The received indices 64 are processed as usual by the indexer 66 and the generated indices of modulation/power allocation matrices are fed to the composite predictor 82 (see FIG. 9B). The advantage of such a system is that there is only one predictor, which decreases hardware complexity. On other hand, if the prediction is erroneous, the overall system throughput may be severely decreased.
3. Hybrid predictor. In practice, a combination of the above approaches may be used to alleviate the problems inherent in both approaches. The initial prediction can be performed on the individual user 38 indices 64 and the composite prediction is then performed on the resulting modulation matrix indices.

The algorithm works for both static and adaptive channel prediction. The creation of the prediction matrices or phrases can be performed in two ways: off-line or on-line. If the channel 34 that the system will operate on is fully known, the off-line (static) approach can be used, where the channel 34 is simulated/analyzed for a given set of parameters and the prediction matrices or phrases are created only once based on that information. This approach is particularly suitable when the channel 34 can be accurately modeled, for example, when the predicted indices represent channel information of one stationary or nomadic user 38 in partial predictor approach (which operates on only one channel type at a time). Another approach is when the transmitter 36 predictor continuously tracks the channel information indices and updates the channel prediction matrices and phrases. This is an on-line (adaptive) approach and is best suited to the cases when the channels 34 cannot be reliably modeled before the implementation of the system. In particular, this method is well suited to composite predictors of modulation matrices. Those matrices are chosen based on the receiver 38 information indices from different users that may be experiencing different channel statistics and off-line modeling of such index trajectories 24 is impractical.

In the next sections, the following notation will be used:
N—the number of codebook indices.
P—the multi-dimensional predictor matrix containing future index samples and their relative frequencies.
D—dictionary of phrases defined as (K+1)-tuples: ([t−K+1], . . . I[t−2], I[t−1], I[t+Δ])
f—frequency of the entries in the matrix P or dictionary D
Δ—the time span of the predictor.
K—the number of indices used to predict future ones.
M—the number of past channel index realizations used in the adaptive prediction algorithm.
I—the index representing CSI vector quantization indices V or D in partial predictors or indices of matrices B or S in composite predictors.

Figure 10:
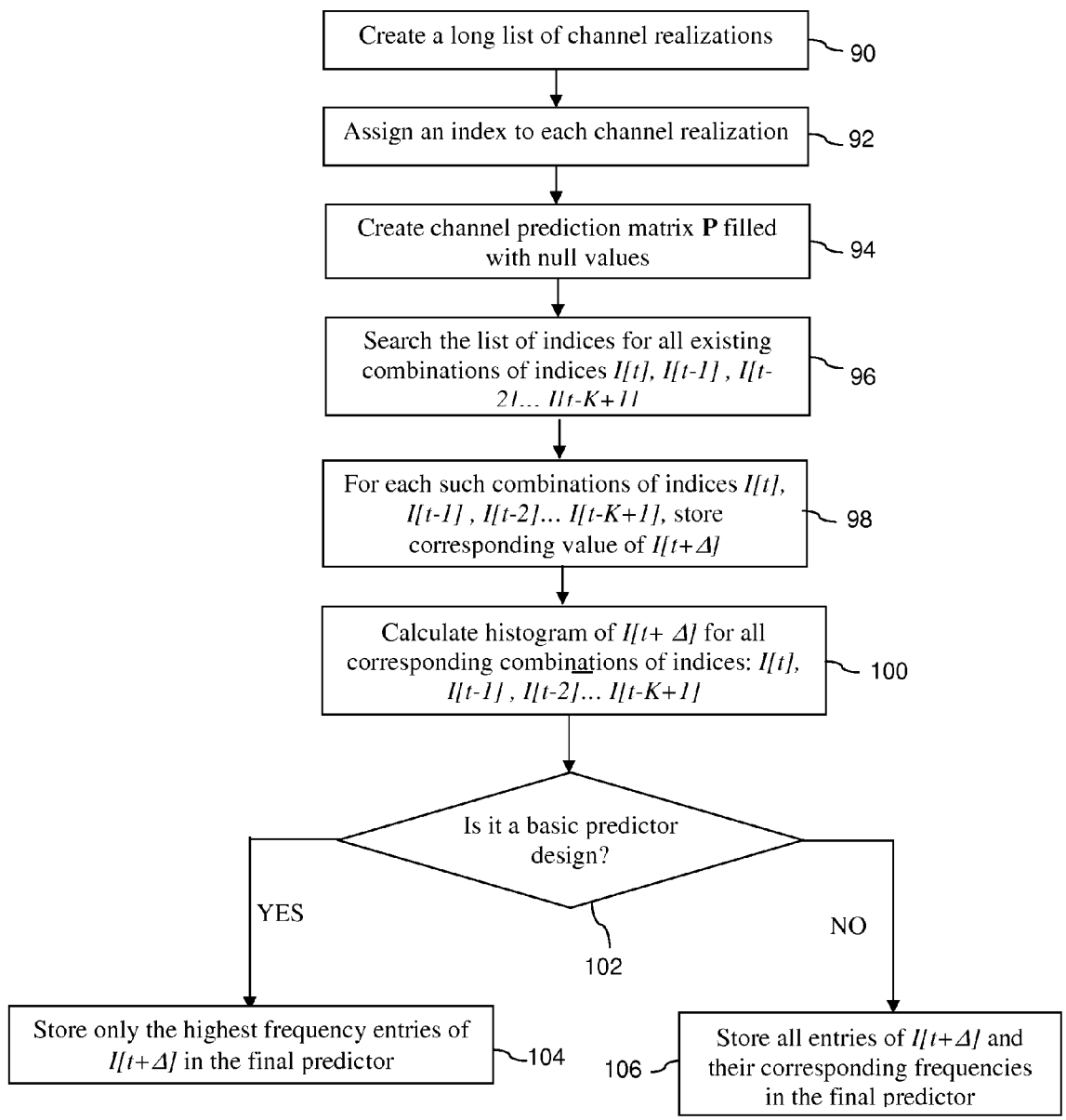
FIG. 10 is a flowchart showing how to design a basic or enhanced predictor.

A static predictor design algorithm for basic enhanced predictors may follow the steps shown in FIG. 10.

1. In step 90, create a long list of channel realizations for given antenna 32 configurations and a given normalized Doppler frequency.
2. In step 92, based on the above channel realizations, create a list of appropriate channel indices I.
3. In step 94, create an empty channel predictor matrix P with dimensions equal to N×N×(K−1).
4. Store null values in all entries of matrix P.
5. In step 96, search the list of channel indices for existing combinations of indices: I[t], I[t−1], I[t−2] . . . I[t−K+1].
6. In step 98, for each instance of above combinations store the corresponding value of I[t+Δ].
7. In step 100, calculate histograms of I[t+Δ] for all corresponding combinations of indices: I[t], I[t−1], I[t−2] . . . I[t−K+1].
8. Store frequencies of I[t+Δ] in positions in matrix P corresponding to I[t], I[t−1], I[t−2] . . . I[t−K+1].
9. In step 102, if the basic predictor is to be used, for each entry I[t+Δ] in the matrix P, choose in step 104 the one with the highest frequency and delete all other ones.
10. If the enhanced predictor is to be used, in step 106 keep all the information in matrix P.

EXAMPLE

Figure 11:
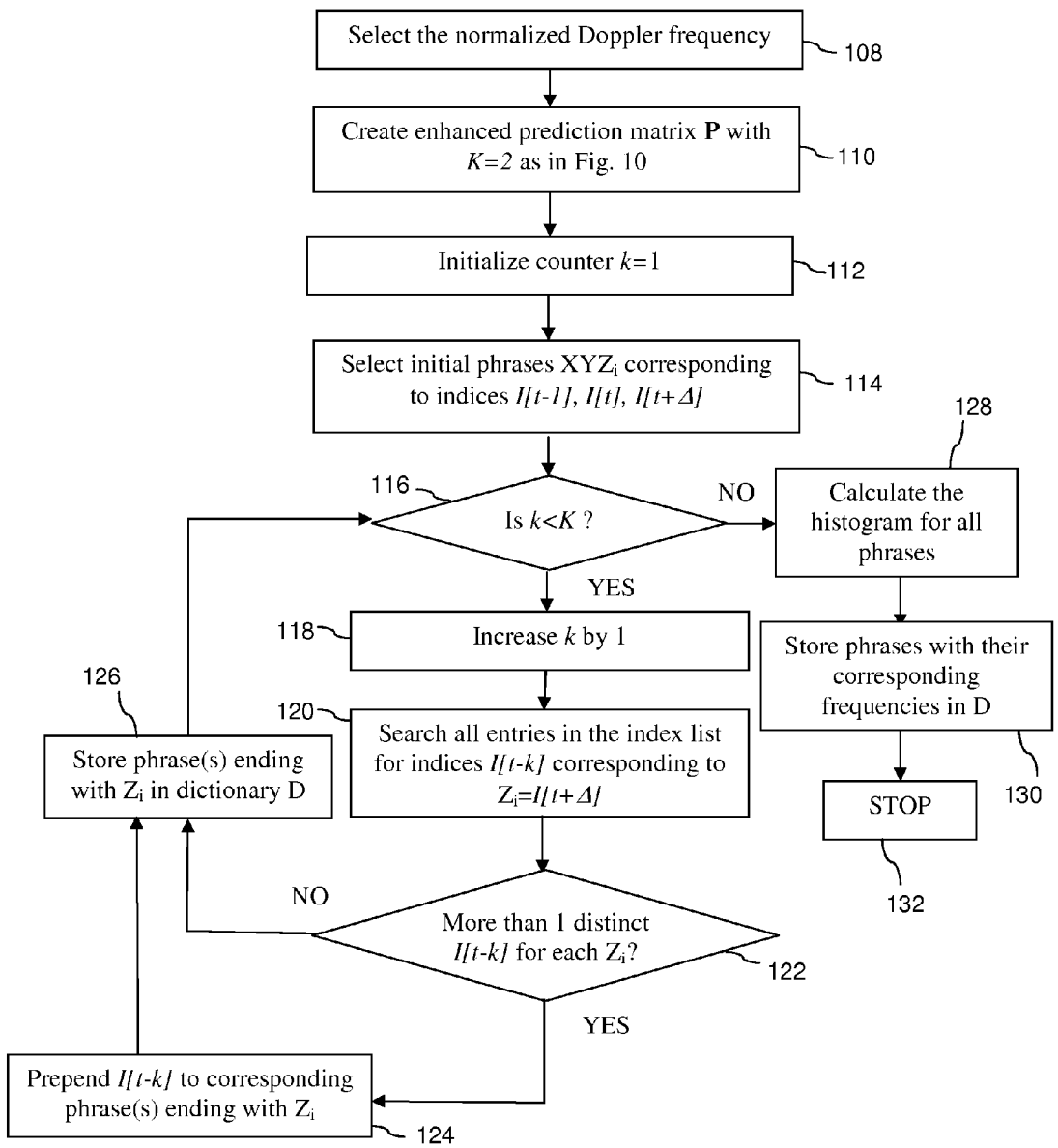
FIG. 11 is a flowchart showing how to design a phrase-based predictor.

Assume that the following string of indices was created (steps 90,92) by the channel emulator:
. . . 142312313 . . . .
The algorithm with parameters K=2 and Δ=1, will identify 96 the following existing tuples of indices: (I[t−1], I[t]):
(1,4); (4,2); (2,3); (3,1); (1,2); (1,3)
Those indices will then be matched 98 with I[t+1] and their histogram calculated 100 as:
(1,4): I[t+1]=2, 1 case;
(4,2): I[t+1]=3, 1 case;
(2,3): I[t+1]=1, 2 cases;
(3,1): I[t+1]=2, 1 case or I[t+1]=3, 1 case
(1,2): I[t+1]=3, 1 case;
(1,3): I[t+1]=3, 1 case;
Finally, the above value will be stored in step 106 in matrix P, after converting histogram values to frequencies as (note that indexing follows the reversed order of tuples):
$P_{4,1}=2$, f=1; $P_{2,4}=3$, f=1; $P_{3,2}=1$, f=1; $P_{1,3}=2$, f=0.5 and $P_{1,3}=3$, f=0.5; $P_{2,1}=3$, f=1; $P_{3,1}=3$, f=1
A static predictor data design algorithm for phrase-based predictors may follows the steps of FIG. 11:
1. In step 108, if scaling (down-sampling) of phrases is allowed, select the minimum normalized Doppler frequency as per design assumptions. Otherwise select operating Doppler frequency.
2. In step, 110, create an enhanced predictor matrix P with K=2, as in the above algorithm.
3. In step 112, initialize counter k=1.
4. For each entry in the prediction matrix P, create in step 114 initial phrases as: $XYZ_i$, where X=I[t−1], Y=I[t] and $Z_i$=I[t+Δ] for all frequencies not equal to 0.
5. Store the phrases $XYZ_i$ in dictionary D.
6. In step 116, if k<K, increase k by 1 step 118. Otherwise STOP (step 132).
7. For each stored phrase, in step 120 search the list of channel indices for index entries $V_j$=I[t−k] that correspond to that phrase's last index $Z_i$=I[t+Δ].
8. In step 122, if there is only one $V_j$ corresponding to $XYZ_i$, store phrase $XYZ_i$, (step 126) in dictionary D with no modifications (no ambiguity).
9. In step 122, if there is more than one index $V_j$ corresponding to $XYZ_i$, prepend prefixes $V_j$=I[t−k] to them (step 124).
10. In step 128, calculate histograms and frequencies of all phrases in D.
11. In step 130, store the new phrases and frequencies in dictionary D.
12. Go to 6 (step 116).

EXAMPLE

Figure 12:
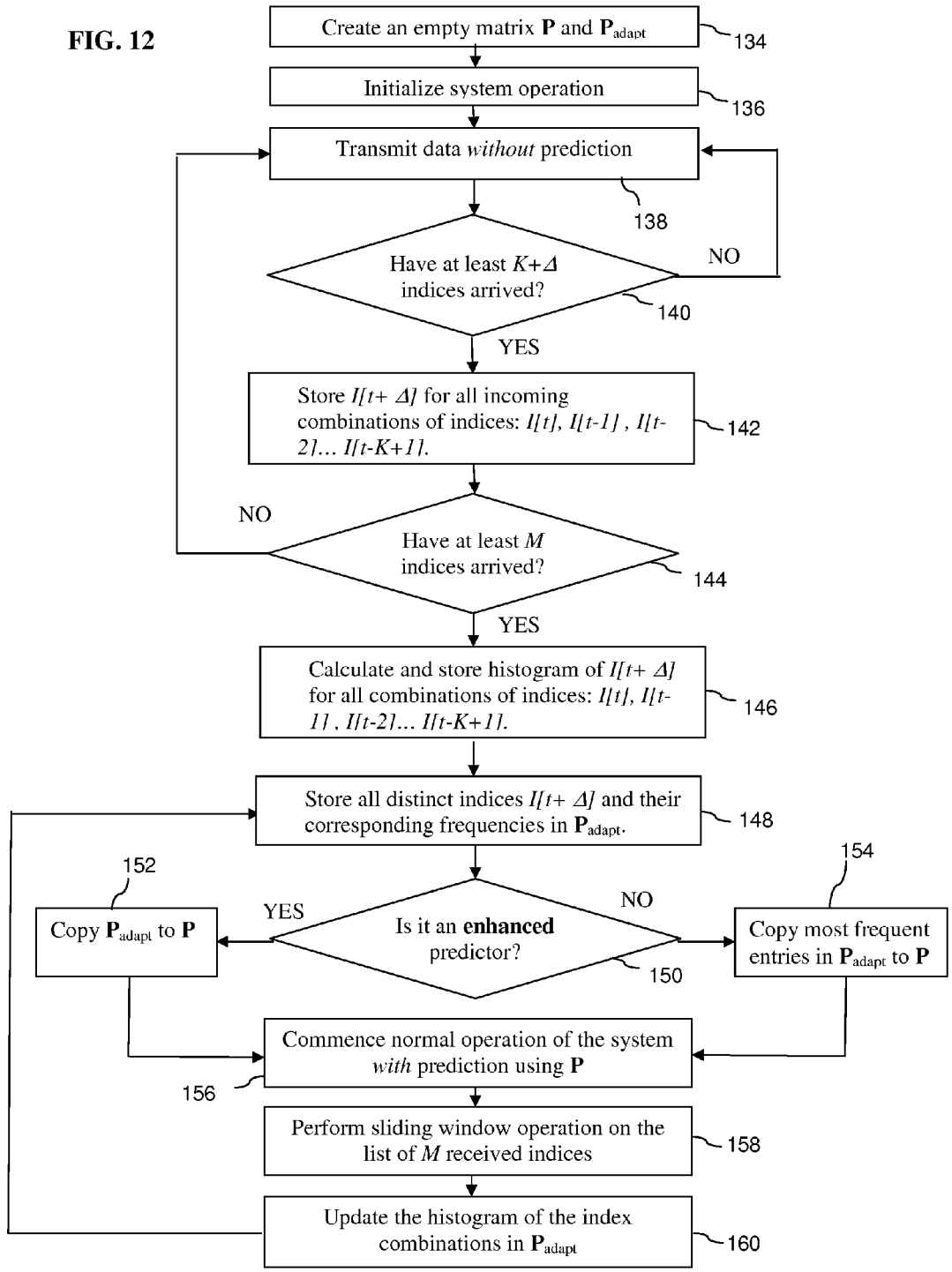
FIG. 12 is a flowchart showing how to adaptively design a basic or enhanced predictor.

Assume that the following string of indices was created 90, 92 by the channel emulator:
. . . 5147312313 . . . .
and the previous algorithm set with K=2 and Δ=1 has identified 110:
$P_{4,1}=7$, f=1; $P_{7,4}=3$, f=1; $P_{3,7}=1$, f=1; $P_{1,3}=2$, f=0.5 and $P_{1,3}=3$, f=0.5; $P_{2,1}=3$, f=1;
The phrases in the dictionary with K=3 will be initially created 114 as:
$D_1$=147, f=1; $D_2$=473, f=1; $D_3$=731, f=1; $D_4$=312, f=0.5; $D_5$=313, f=0.5; $D_6$=123, f=1;
In the next step, the phrases will be extended 124 as follows:
$D_1$=147, f=1; (no extension, tuple containing indices 14 predicts 7 with no ambiguity)
$D_2$=473, f=1; (no extension, tuple containing indices 47 predicts 3 with no ambiguity)
$D_3$=731, f=1; (no extension, tuple containing indices 73 predicts 1 with no ambiguity)
$D_4$=7312, f=1; (prepending with 7, tuple containing only indices 31 is ambiguous)
$D_5$=2313, f=1; (prepending with 2, tuple containing only indices 31 is ambiguous)
$D_6$=123, f=1; (no extension, tuple containing indices 12 predicts 3 with no ambiguity)
where histograms and frequencies were updated for new longer phrases. As one can see, due to the extension of some of the phrases, the prediction ambiguity disappeared.
An exemplary adaptive predictor data design algorithm for basic and enhanced predictors is shown in FIG. 12.
1. In step 134, create an empty matrix $P_{adapt}$ with dimensions equal to N×N×(K−1).
2. Store the null values in all matrix $P_{adapt}$ entries.
3. In step 138, commence the regular system operation process as described in previous sections without using any prediction algorithms.
4. In step 140, after K+Δ indices have been received, begin storing (step 142) the values of I[t+Δ] for all incoming combinations of indices: I[t], I[t−1], I[t−2] . . . I[t−K+1].

5. Continue the operation from step 4 until as determined in step 144 an index list with a length of M has been created.
6. Calculate histogram of I[t+Δ] for all combinations of indices: I[t], I[t−1], I[t−2] . . . I[t−K+1] and store it. (step 146)
7. In step 148, store all values of indices I[t+Δ] with their frequencies in $P_{adapt}$.
8. In step 150, if the basic predictor is to be used, for each entry I[t+Δ] in the matrix $P_{adapt}$, choose the one with the highest frequency and store it (step 154) in the channel predictor matrix P.
9. In step 150, if the enhanced predictor is to be used, take all the information from matrix $P_{adapt}$ and store it (step 152) in the channel predictor matrix P.
10. In step 156, commence the normal operation of the system with the predictor matrix P.
11. As the channel indices are received at the transmitter 36, update (steps 160, 148) the matrix $P_{adapt}$ using a sliding window approach (step 158):
    a. After the first new index is received, subtract 1 from the histogram entry corresponding to I[t−K+1] . . . I[t−2], I[t−1], I[t] and I[t+Δ] from the first K+Δ values in the index list.
    b. Discard the first entry in the received index list.
    c. Add the new entry to the end of the received index list.
    d. Add 1 to the histogram entry corresponding to I[t−K+1] . . . I[t−2], I[t−1], I[t] and I[t+Δ] from the last K+Δ values in the index list.
    e. Go to 8 (step 150).

NOTE: The algorithm of FIG. 12 may be initialized by storing pre-calculated values of matrix P from the off-line version of the algorithm into $P_{adapt}$. In such a case, the adaptive algorithm is initialized from step 150.

EXAMPLE

Assume enhanced predictor with M=10, K=2 and Δ=1. The following string of indices was received at the base station 36:
5142312313
at this point, the algorithm has received 144 M=10 indices and identified 146 the following tuples (I[t−1], I[t], I[t+Δ]) and their histograms:
(5,1,4): 1 case; (1,4,2): 1 case; (4,2,3): 1 case; (2,3,1): 2 cases; (3,1,2): 1 case and
(3,1,3): 1 case; (1,2,3): 1 case In the next step, the algorithm creates 148 the prediction matrix as follows:
$P_{1,5}=4$, f=1; $P_{4,1}=2$, f=1; $P_{2,4}=3$, f=1; $P_{3,2}=1$, f=1; $P_{1,3}=2$, f=0.5 and $P_{1,3}=3$, f=0.5; $P_{2,1}=3$, f=1;

In the next transmission epoch, the base station 36 receives the new index 1. First, the previous histogram is modified by subtracting 1 from the entry (5,1,4) as follows:
(5,1,4): 0, (1,4,2): 1, (4,2,3): 1, (2,3,1): 2, (3,1,2): 1 and (3,1,3): 1, (1,2,3): 1,
and, since histogram value for the tuple (5,1,4) is 0, this tuple is removed from the list.
Then the first entry in the received list is discarded as well and new index added:
1423123131
Secondly, a new entry is created by adding the tuple (1,3,1):
(1,4,2): 1, (4,2,3): 1, (2,3,1): 2, (3,1,2): 1 and (3,1,3): 1, (1,2,3): 1, (1,3,1): 1
And the new prediction matrix is created (step 148) as:
$P_{4,1}=2$, f=1; $P_{2,4}=3$, f=1; $P_{3,2}=1$, f=1; $P_{1,3}=2$, f=0.5 and $P_{1,3}=3$, f=0.5; $P_{2,1}=3$, f=1; $P_{3,1}=1$, f=1;

In the next transmission epoch, the base station 36 receives the new index 3. First, the previous histogram is modified by subtracting 1 from the entry (1,4,2) as follows:
(1,4,2): 0, (4,2,3): 1, (2,3,1): 2, (3,1,2): 1 and (3,1,3): 1, (1,2,3): 1, (1,3,1): 1
and, since histogram value for the tuple (1,4,2) is 0, this tuple is removed from the list. Then the first entry in the received list is discarded as well and new index added:
4231231313
Secondly, a new entry is created by adding 1 to the tuple (3,1,3):
(4,2,3): 1, (2,3,1): 2, (3,1,2): 1 and (3,1,3): 2, (1,2,3): 1, (1,3,1): 1
And the new prediction matrix is created (step 148) as:
$P_{2,4}=3$, f=1; $P_{3,2}=1$, f=1; $P_{1,3}=2$, f=0.333 and $P_{1,3}=3$, f=0.666; $P_{2,1}=3$, f=1; $P_{3,1}=1$, f=1;
And so on . . . .

Figure 13:
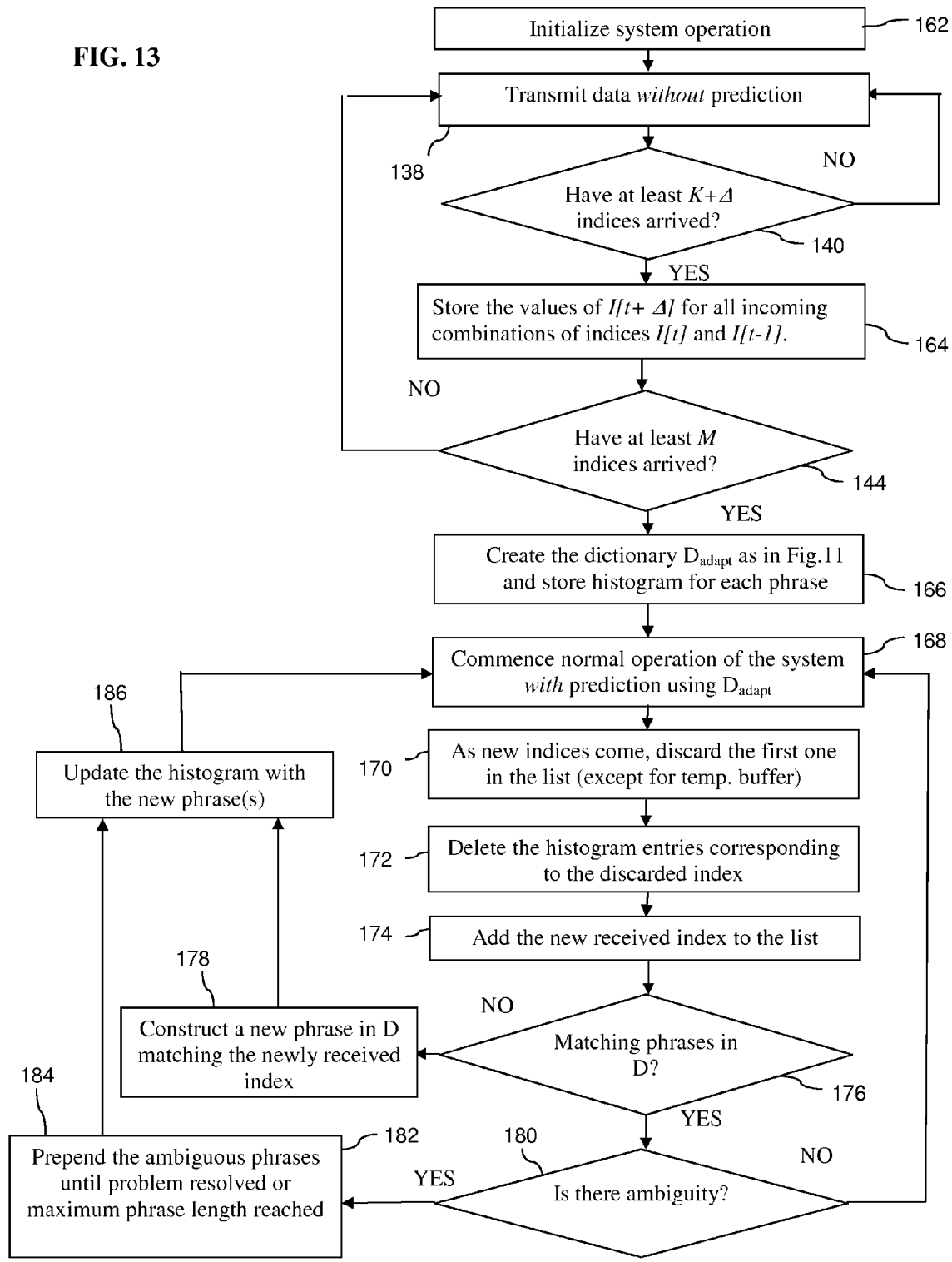
FIG. 13 is a flowchart showing how to adaptively design a phrase-based predictor.

An adaptive predictor data design algorithm for phrase-based predictors may follow the steps of FIG. 13.
1. In step 162, initialize system counters.
2. In step 138, commence the regular system operation process as described in previous sections without using any prediction algorithms.
3. Continue the operation from step 138 until (step 144) an index list with a length of M has been created.
4. In step 166, using the static prediction data algorithm, create dictionary $D_{adapt}$ based on the index list with length M
5. Store the histogram for each phrase.
6. In step 168, commence the normal operation of system with the prediction using dictionary $D_{adapt}$.
7. As the new channel index is received at the transmitter 36, use a sliding window approach to the received index list:
    a. After the first new index is received, subtract 1 from the histogram entry or entries corresponding to the phrase based on the starting values in the index list. (step 172)
    b. Discard the first entry in the index list but keep the last discarded K+Δ−1 indices in a temporary buffer. (step 170)
    c. Add the new entry to the end of the index list. (step 174)
8. Update the dictionary $D_{adapt}$ using one of three cases:
    a. In step 176, if none of the existing phrases in D could be used to predict the newly received index I[t+Δ], add (step 178) such a new phrase to the dictionary.
    b. If any of the already existing phrases in D could correctly predict the new index I[t+Δ] go to 6 (step 180).
    c. Check whether any of the already existing phrases in D predicted the new index I[t+Δ] with ambiguity (step 180). If there are such phrases and they are not longer than a length limit threshold, prepend them (step 184) with past indices from the index list (use temporary buffer if necessary) until they are not ambiguous or the length limit is reached.
    d. Add 1 to the histogram entry corresponding to the new phrase and update the frequency values in the dictionary (step 186).
9. Go to 6 (step 180).

NOTE: The above algorithm can be initialized by storing pre-calculated values of phrases D from the off-line version of the algorithm into $D_{adapt}$. In such a case, the adaptive algorithm is initialized from step 180.

EXAMPLE

Assume enhanced predictor with M=10, K=2 and Δ=1. The following string of indices was received at the base station 36:
5142312313
at this point, the algorithm has received 144 M=10 indices and identified 164 the following tuples (I[t−1], I[t], I[t+Δ]) and their histograms:
(5,1,4): 1 case; (1,4,2): 1 case; (4,2,3): 1 case; (2,3,1): 2 cases; (3,1,2): 1 case and
(3,1,3): 1 case; (1,2,3): 1 case In the next step, the algorithm creates in step 166 the adaptive dictionary $D_{adapt}$ as follows:
$D_1$=514, f=1; $D_2$=142, f=1; $D_3$=423, f=1; $D_4$=231, f=1; $D_5$=312, f=0.5; $D_6$=313, f=0.5; $D_7$=123, f=1;

In the next transmission epoch, the base station 36 receives the new index 1. First, the dictionary is searched for the phrase corresponding to the starting values in the index list, this is the $D_1$=514: f=1 entry and the previous histogram is modified in step 172 by subtracting as follows:
(5,1,4): 0, (1,4,2): 1, (4,2,3): 1, (2,3,1): 2, (3,1,2): 1, (3,1,3): 1, (1,2,3): 1
and, since histogram value for the tuple (5,1,4) is 0, this tuple is removed from the list and the corresponding phrase $D_1$=514: f=1 removed from dictionary. Then the first entry in the received list is discarded (step 170) as well (but kept in the temporary buffer) and new index added in step 174 as:
(5)1423123131

Secondly, the modified dictionary is searched in step 176 for the entries that could correspond to the ending values of the updated list. Since there is no such phrase, a new tuple (1,3,1): 1 and corresponding phrase are added (steps 178,186) to the histogram as
(1,4,2): 1, (4,2,3): 1, (2,3,1): 2, (3,1,2): 1, (3,1,3): 1, (1,2,3): 1, (1,3,1): 1
And to the dictionary as
$D_1$=131: f=1; $D_2$=142: f=1; $D_3$=423: f=1; $D_4$=231: f=1; $D_5$=312: f=0.5; $D_6$=313: f=0.5; $D_7$=123: f=1;

In the next transmission epoch, the base station 36 receives the new index 3. First, the previous histogram is modified in step 172 by subtracting 1 from the entry (1,4,2) as follows:
(1,4,2): 0, (4,2,3): 1, (2,3,1): 2, (3,1,2): 1, (3,1,3): 1, (1,2,3): 1, (1,3,1): 1
and, since histogram value for the tuple (1,4,2) is 0, this tuple is removed from the list and the corresponding phrase $D_2$=142: f=1 removed from dictionary. Then the first entry in the received list is discarded in step 170 to the temporary buffer and new index added in step 174 as:
(51)4231231313

Secondly, the modified dictionary is searched in step 176 for the entries that could correspond to the ending values of the updated list. There are two relevant phrases in this case: $D_5$=312: f=0.5 and $D_6$=313: f=0.5. As determined by step 180 there is an ambiguity here, histogram entries are prepended in step 184 as:
(4,2,3): 1, (2,3,1): 2, (2,3,1,2): 1, (2,3,1,3): 1, (1,2,3): 1, (1,3,1): 1
and dictionary D modified as:
$D_1$=131: f=1; $D_2$=423: f=1; $D_3$=231: f=1; $D_4$=2312: f=0.5; $D_5$=2313: f=0.5; $D_6$=123: f=1;

The ambiguity still exists, so new prepending in step 184 takes place (assuming that the length of the phrase is not over the threshold) as:
(4,2,3): 1, (2,3,1): 2, (4,2,3,1,2): 1, (1,2,3,1,3): 1, (1,2,3): 1, (1,3,1): 1 and dictionary D modified in step 186 as:
$D_1$=131: f=1; $D_2$=423: f=1; $D_3$=231: f=1; $D_4$=42312: f=1; $D_5$=12313: f=1; $D_6$=123: f=1;
And the ambiguity is removed.

In the next transmission epoch, the base station 36 receives the new index 1. First, the previous histogram is modified in step 172 by subtracting 1 from the entries (4,2,3) and (4,2,3,1,2) as follows:
(4,2,3): 0, (2,3,1): 2, (4,2,3,1,2): 0, (1,2,3,1,3): 1, (1,2,3): 1, (1,3,1): 1
and, since histogram values for tuples (4,2,3) and (4,2,3,1,2) are 0, these tuples are removed from the list and the corresponding phrases $D_2$=423: f=1 and $D_4$=42312: f=1 removed from dictionary. Then the first entry in the received list is discarded 170 to the temporary buffer and new index added in step 174 as:
(14)2312313131

Secondly, the modified dictionary is searched in step 176 for the entries that could correspond to the ending values of the updated list. There is a relevant phrases in this case: $D_1$=131: f=1. As in step 180 there is no ambiguity here, histogram entries are simply updated as:
(2,3,1): 2, (1,2,3,1,3): 1, (1,2,3): 1, (1,3,1): 2 and dictionary D becomes:
$D_1$=131: f=1; $D_2$=231: f=1; $D_3$=12313: f=1; $D_4$=123: f=1;
And so on . . . .

Figure 14:
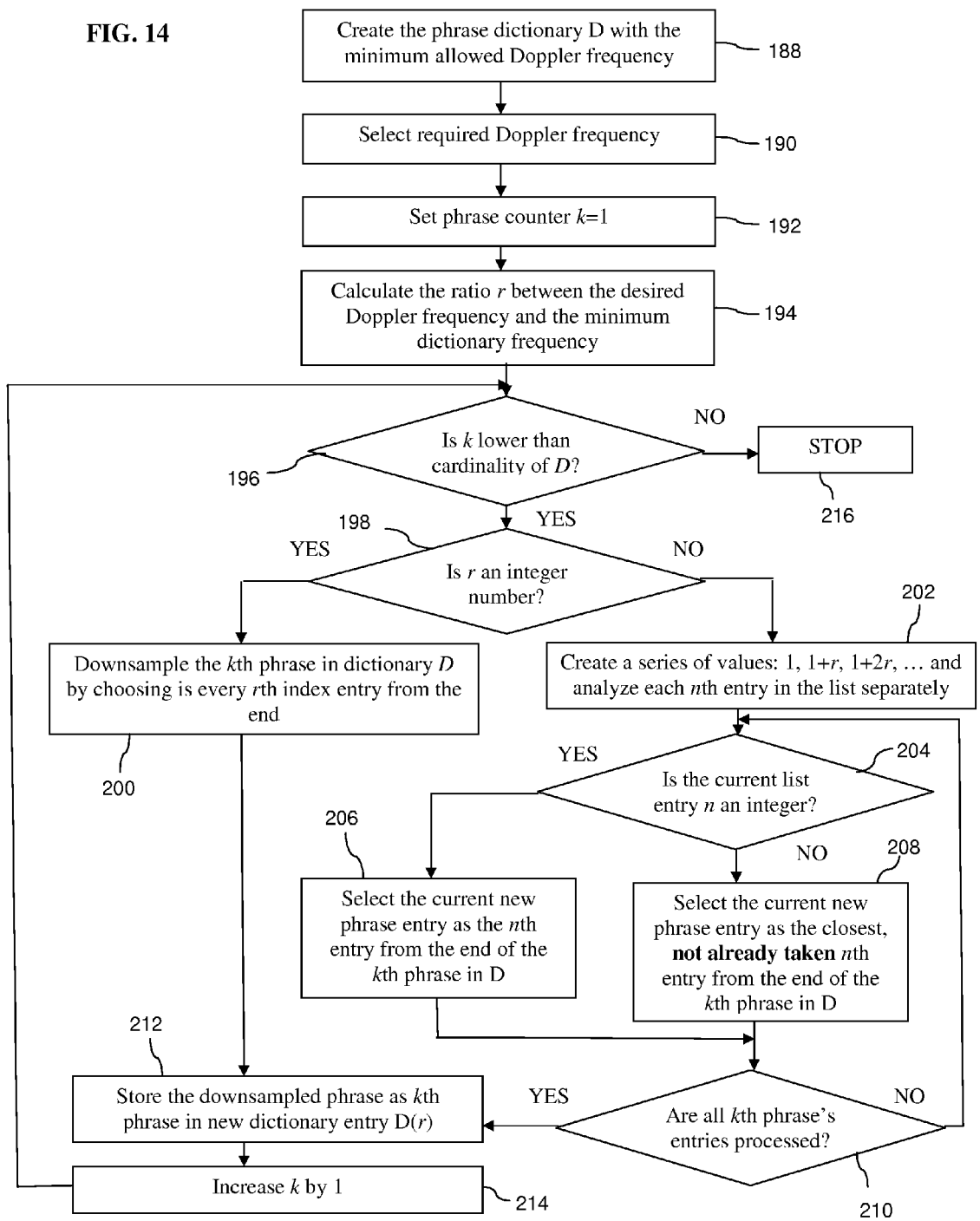
FIG. 14 is a flowchart showing downsampling for a phrase-based predictor.

A down-sampling algorithm operation for phrase-based predictors is shown in FIG. 14 with the following steps:
1. In step 188, initialize the algorithm with the dictionary D created using one of the previous methods with the minimum normalized Doppler frequency as per design assumptions.
2. In step 190, set the Doppler frequency at the desired level.
3. In step 194, calculate the ratio r between the desired normalized Doppler frequency and the minimum normalized Doppler frequency for dictionary D.
4. In step 192, set the phrase counter as k=1;
5. In step 196, if entry counter k is larger than cardinality of D, STOP (step 216).
6. In step 198 if the ratio r between the Doppler frequencies in step 3 is integer:
   a. In step 200 modify the existing kth entry in dictionary D by selecting indices separated by r entries, going backwards from the last entry.
   b. In step 212 store the down-sampled entry in the dictionary D(r).
7. In step 198 if the ratio r between the Doppler frequencies in step 3 is not an integer:
   a. In step 202 create a series of values: 1, r+1, 2r+1, 3r+1, . . . .
   b. For each (step 210) value in the series that is (step 204) an integer, select the corresponding kth entry from the end in the phrase in dictionary D (step 206) (for example, for r=1.5, the third entry in the modified dictionary will be equal to the fourth one in the original dictionary 2r+1=4).
   c. For each (step 210) value in the series which is not (step 204) an integer, select the closest integer entry from the end in the phrase in dictionary D, which is not equal to the previous entry (step 208) (As an example, for r=1.45, the second entry in the modified dictionary will be equal to the second one in the original dictionary r+1=2.45. For r=1.55, the second entry in the modified dictionary will be equal to the third one in the original dictionary r+1=2.55).
   d. In step 212, store the down-sampled entry in the dictionary D(r).
8. In step 214, increase phrase counter as k=k+1.
9. Go to 5 (step 194).

EXAMPLE

Assume that the following dictionary D has been created in the design phase:
$D_1=123456$, f=1; $D_2=190442$, f=0.3; $D_3=190445$, f=0.7
For r=2, the dictionary D will be down-sampled to D(r=2) as:
$D_1=\_2\_4\_6$, f=1; $D_2=\_9\_4\_2$, f=0.3; $D_3=\_9\_4\_5$, f=0.7
For r=1.45, the dictionary D will be down-sampled to D(r=1.45) as:
$D_1=\_23\_56$, f=1; $D_2=\_90\_42$, f=0.3; $D_3=\_90\_45$, f=0.7
For r=1.55, the dictionary D will be down-sampled to D(r=1.55) as:
$D_1=\_1\_34\_6$, f=1; $D_2=\_1\_04\_2$, f=0.3; $D_3=\_1\_04\_5$, f=0.7.

Figure 15:
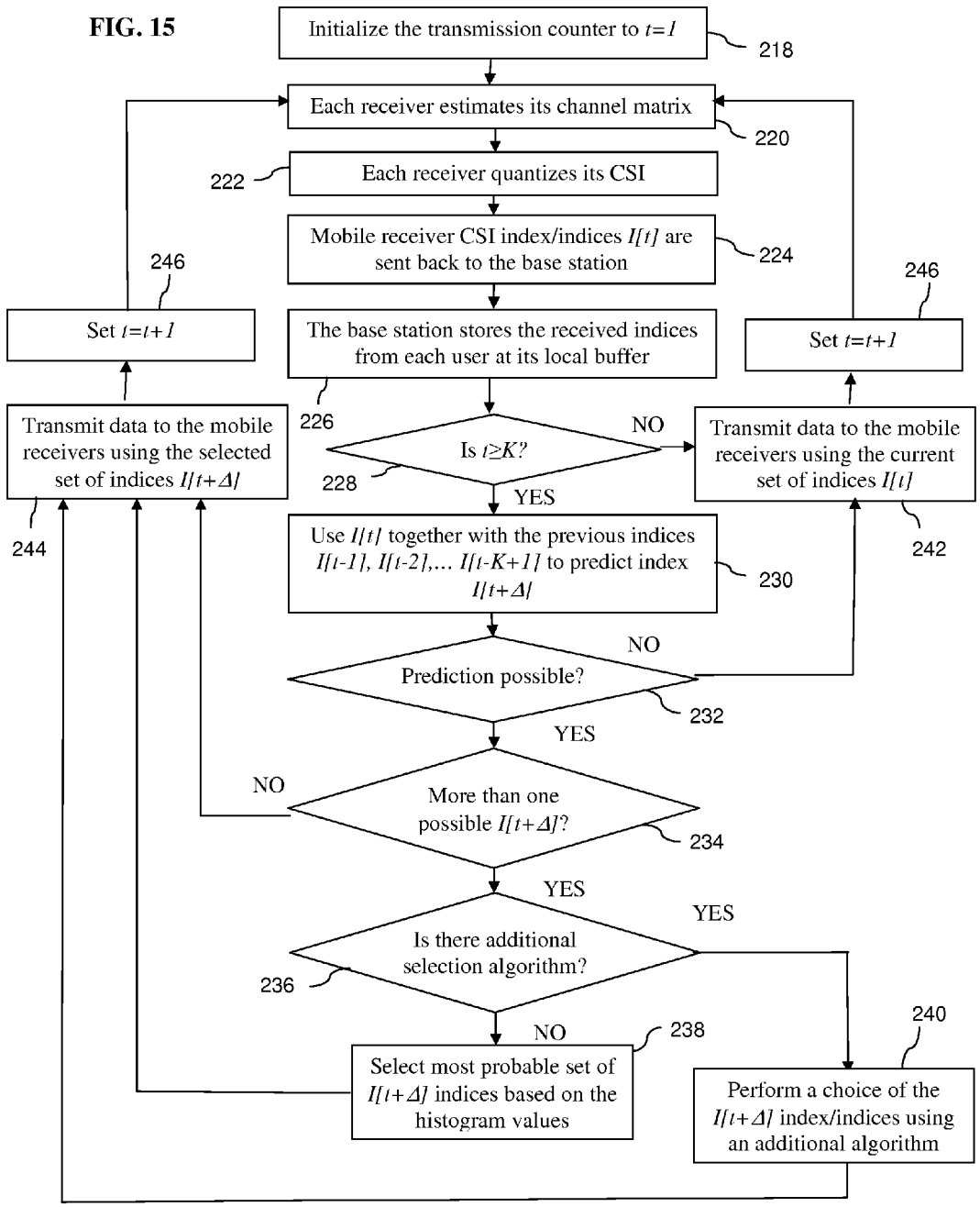
FIG. 15 is a flowchart showing how to adapt to delay using a prediction algorithm.

A prediction algorithm for delay compensation may follow the steps of FIG. 15:

1. In step 218, initialize transmission epoch to t=1.
2. In step 220, each receiver 38 estimates its channel matrix H[t] (step 40).
3. In step 222, each receiver 38 performs the vector quantization of the channel state information.
4. In step 224, the channel state information indices are fed back to the transmitter 36 using the methods described in previous sections.
5. In step 226, the transmitter 36 stores the received indices in its buffer.
6. In step 228, if t≥K, use the prediction algorithm as follows:
   a. In step 230, the transmitter 36 uses the newly received indices as I[t] in either partial or composite predictor, and together with the previous indices I[t−1], I[t−2], . . . I[t−K+1] uses them to predict index I[t+Δ] (where Δ represents the delay 26 time in terms of the number of feedback frames) using one of the methods described earlier in the document (prediction matrix lookup or phrase matching).
   b. In step 232, if the prediction is not possible, reuse the previously received index (step 242).
   c. In step 234, if the predictor produces more than 1 probable future index, perform an additional selection process using an optional plug-in algorithm (step 240) or (step 236) select the most probable value (step 238).
   d. Select the group of receivers to be activated in the next transmission epoch based on the predicted index value(s) I[t+Δ];
   e. In step 244, the signal is transmitted to the selected active receivers 38.
7. In step 228, if the above inequality is not met, the transmitter 36 performs the selection of active users 38 using the current set of indices and chooses (step 68) the optimum modulation matrices.
8. In step 242, the signal is transmitted to the selected active receivers 38 based on the received index value(s) I[t].
9. In step 246, increase transmission epoch as t=t+1.
10. Go to 2 (step 220).

EXAMPLE

Assume that one of the algorithms discussed previously has created the following set of entries in the prediction table P with parameters set to K=2 and Δ=1 (a delay 26 of 1 frame is assumed in the system):
$P_{4,1}=7$, f=1; $P_{7,4}=3$, f=1; $P_{3,7}=1$, f=1; $P_{1,3}=2$, f=0.5 and $P_{1,3}=3$, f=0.5; $P_{2,1}=3$, f=1;

During the normal operation of the system, the indices fed back in step 224 from the receiver 38 are as follows:
. . . 731235 . . . .

By the time they reach the transmitter 36, a delay 26 of 1 frame occurs due to propagation time, processing latency, etc., and now the correct set of indices used for transmission should be:
. . . _1235 . . . .

The processor at the base station 36 recreates the above string based on the received indices and the prediction table P (or equivalently the dictionary D).

The algorithm works as follows:
The base station 36 receives indices:
. . . 73
and the predictor processor looks for a entry in table $P_{3,7}$, which is equal to 1 with f=1 (equivalently, the predictor can search for a phrase in D, starting with 73). Hence, for the next transmission, the transmitter 36 will select index 1.

The next received index is 1:
. . . 731
and the predictor processor looks for a entry in table $P_{1,3}$, which is equal to 2 with f=0.5 or 3 with f=0.5. Hence, depending on the preset method of operation, for the next transmission, the transmitter will select either index 2 or 3. Usually, it will be the most probable index but other selection criteria can be easily implemented. In this case, it is assumed that the transmitter 36 breaks ties at random, which results in next index being 2.

The next received index is 2:
. . . 7312
and the predictor processor looks for a entry in table $P_{2,1}$, which is equal to 3 with f=1. Hence, for the next transmission, the transmitter will select index 3.

The next received index is 3:
. . . 73123
and the predictor processor looks for an entry in table $P_{3,2}$, which does not exist. The transmitter 36 will re-use instead the index 3. 242

This results in the set of indices used by the base station 36 equal to:
. . . _1233 . . . .
which almost corresponds to the actual indices required after the delayed 26 feedback has occurred. The missing predictor entry can be compensated in the future if an adaptive predictor is used.

Figure 16:
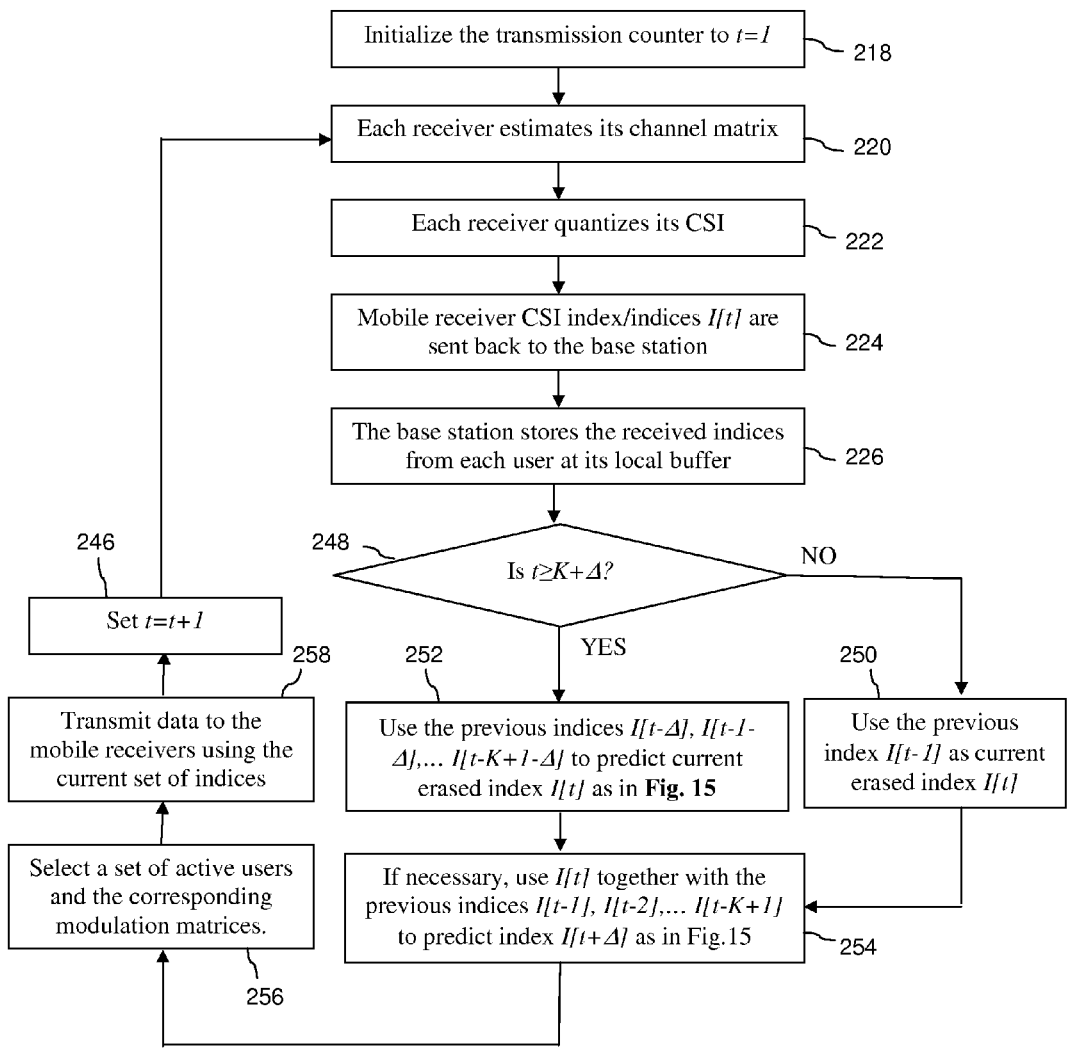
FIG. 16 is a flowchart showing how to compensate for feedback erasure using a prediction algorithm.

A prediction algorithm for feedback erasure compensation may follow the steps of FIG. 16:

1. In step 218, initialize transmission epoch to t=1.
2. In step 220, each receiver 38 estimates 40 its channel matrix H[t].
3. In step 222, each receiver 38 performs the vector quantization of the channel state information.
4. In step 224, the channel state information indices are fed back to the transmitter 36 using the methods described in previous sections.
5. In step 226, the transmitter 36 stores the received indices in its buffer.
6. If some of the transmitted indices are deemed to be erasures due to the transmission loss or index error detection, recover the missing indices as follows:
   a) In step 248, if t≥K+Δ, the transmitter 36 uses the previous indices I[t−Δ], I[t−1−Δ], . . . I[t−K+1−Δ] to predict current erased index I[t] using one of the prediction methods described earlier in the document (step 252).
   b) In step 248, if the above inequality is not met, copy the previous index I[t−1] as I[t] (step 250).

7. In step 254, after recovering the current index I[t], perform the regular channel prediction as necessary. 254
8. Continue system operation in a normal way (steps 256, 258 and 246).
9. Go to 2 (step 220).

EXAMPLE

Assume that one of the algorithms discussed previously created a following set of entries in the prediction table P with parameters set to K=2 and Δ=1:
$P_{4,1}=7$, f=1; $P_{7,4}=3$, f=1; $P_{3,7}=1$, f=1; $P_{1,3}=2$, f=0.5 and $P_{1,3}=3$, f=0.5; $P_{2,1}=3$, f=1;

During the normal operation of the system, the indices fed back from the receiver 38 in step 224 are as follows:
...7312....

However, during the transmission, the index 1 was lost due to some additional interference or other reason. This results in the string of indices:
...73×2....

The algorithm compensating the erasure will identify an entry in the table $P_{3,7}$ (or equivalently, a phrase in the dictionary D starting with 73), which is equal to 1 with f=1 and recover (in step 252) the erasure as:
...7312....

If the channel erasure compensation has been used prior to the regular prediction phase, the recovered index can now be used in a prediction mechanism (step 254) described in the previous algorithm.

Figure 17:
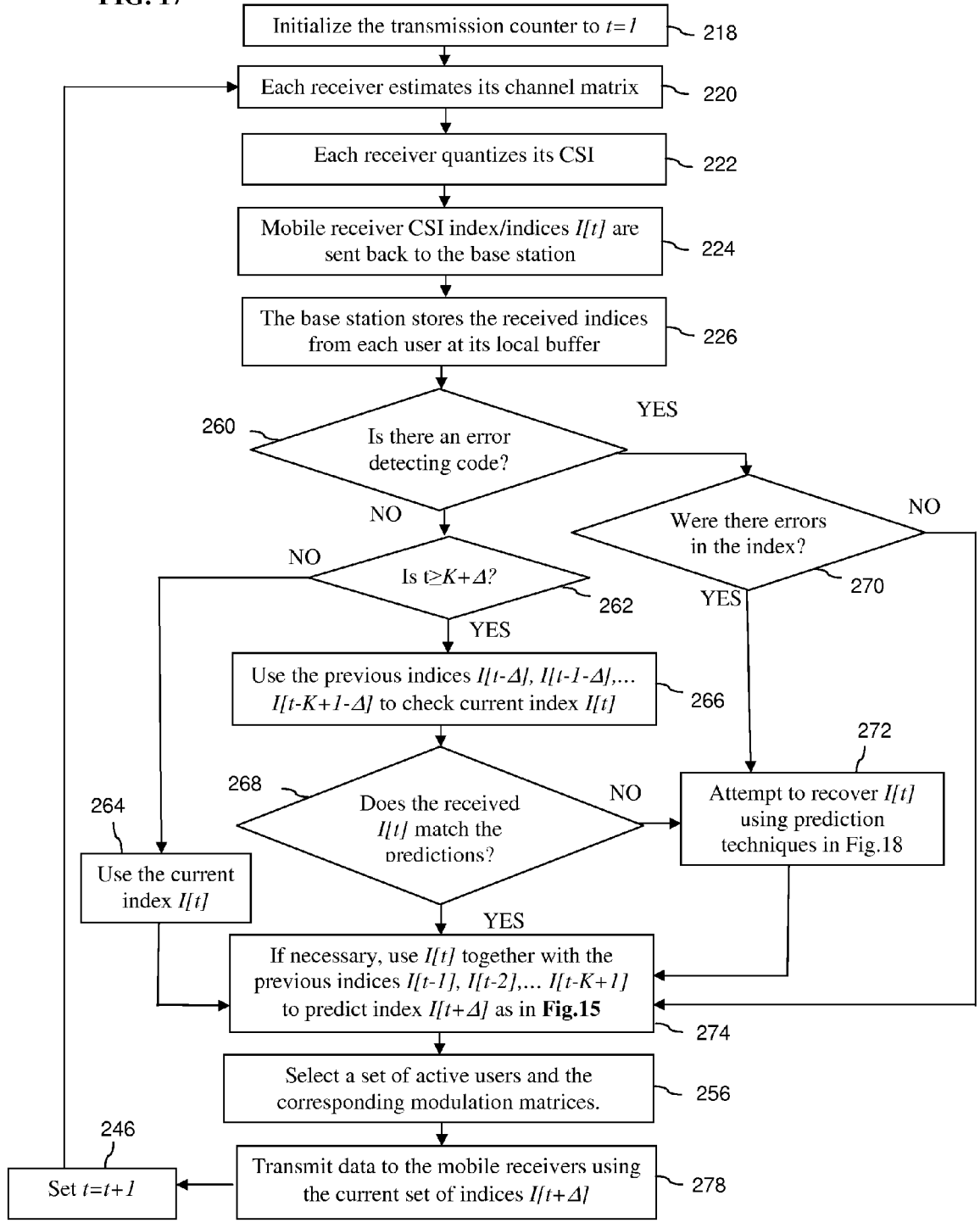
FIG. 17 is a flowchart showing how to compensate for feedback errors using a prediction algorithm, with the steps for recovering the actual index once an error has been identified shown as a black box.
Figure 18:
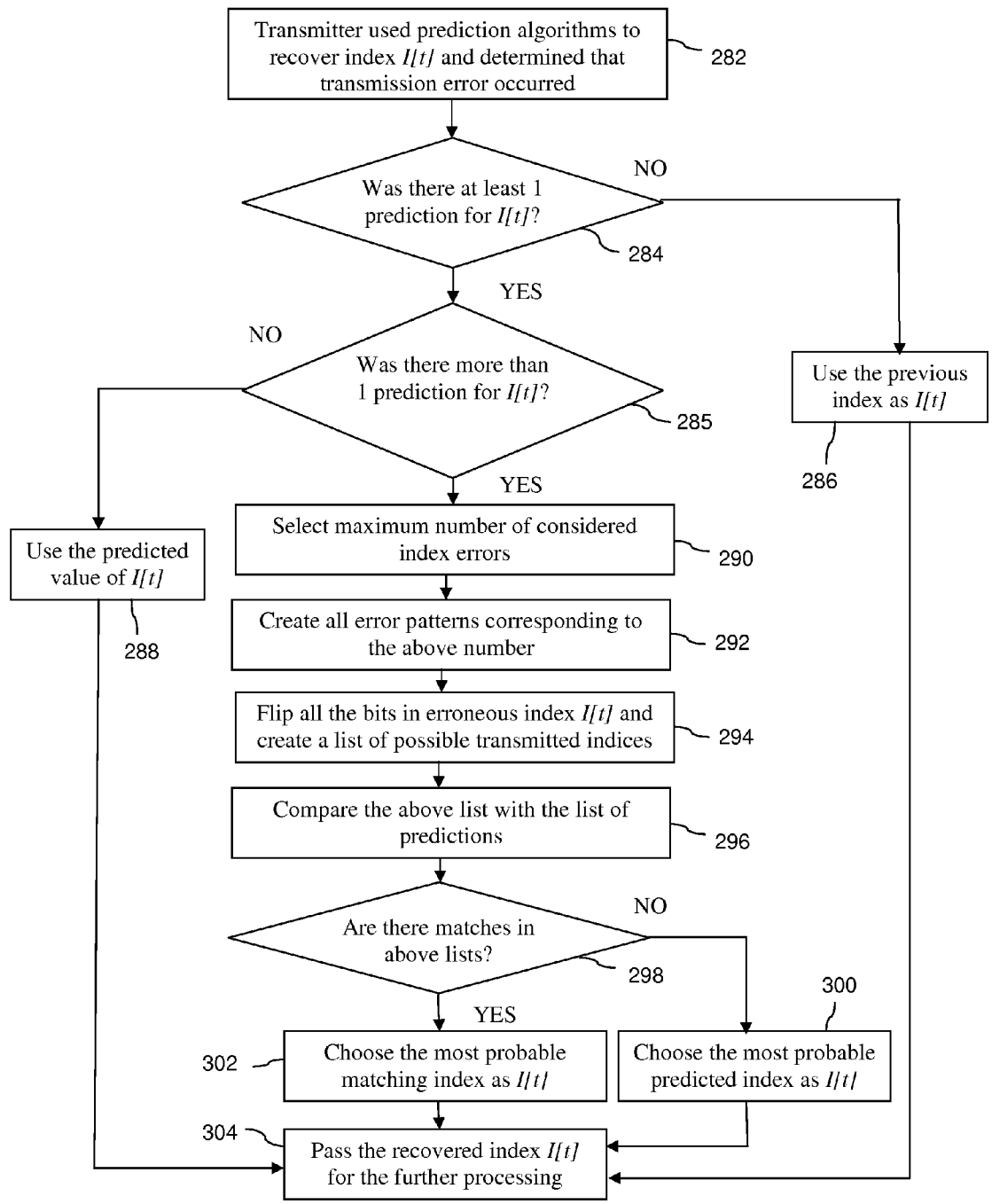
FIG. 18 is a flowchart showing the steps for recovering the actual index once an error has been identified as in FIG. 17.

An algorithm for feedback error compensation may follow the steps of FIGS. 17 and 18:
1. In step 218, initialize transmission epoch to t=1.
2. In step 220, each receiver 38 estimates 40 its channel matrix H[t].
3. In step 222, each receiver 38 performs the vector quantization of the channel state information.
4. In step 224, the channel state information indices are fed back to the transmitter 36 using the methods described in previous sections.
5. In step 260, if the feedback link incorporates an error detecting code, the transmitter 36 may use it to check whether there was an error 28 in feedback transmission (step 270).
6. In step 260, if the feedback link does not incorporate an error detecting code and if t≥K+Δ (step 262), the transmitter 36 may use the prediction algorithm to decide whether there was an error 28 in feedback transmission as follows:
   a. In step 266, use the previously received indices to predict the value of the current index I.
   b. In step 268, if none of the generated predictions correspond to the actually received index, transmitter 36 decides that a feedback transmission error 28 has occurred*.
   c. In step 268, if it is impossible to generate a prediction (no entry in the prediction matrices or dictionaries), transmitter 36 decides that a feedback transmission error 28 has occurred*.
7. In step 262, if t<K+Δ, use the received index I[t] without modifications (step 264).
8. In step 282, if the transmitter 36 discovered that a transmission error has taken place in steps 5 or 6, the erroneous index 28 is regenerated as follows (step 272):
   a. If there is only one prediction for the index I (steps 284 and 285), use the predicted version of the index instead of the received one (step 288).
   b. In step 285, if the predictor signalizes more than one possible index, correct the erroneous index 28 as follows:
      In step 290, select a maximum number of considered bit errors (1,2,3 ... per index).
      In step 292, based on the above number, create all possible error patterns.
      In step 294, based on the above error patterns, flip the bits in the received index I[t] and store the resulting indices in the separate list.
      In step 296, compare the above list with the set of possible predictions for index I[t].
      In step 302, use the most probable index from the set of bit-flipped indices based on the corresponding frequencies stored in the predictor.
      In step 298, if there is no match between the predictions and bit-flipped indices, choose the most possible index from the predictor list (step 300).
   c. In step 284, if there are no predictions available for the current index, use the previous index (step 286)
9. After recovering the current index I[t] (steps 304 and 272), perform the regular channel prediction as necessary (step 274).
10. In step 256, the transmitter 36 performs the selection of active users 38 using any method (maximum fairness, maximum throughput, etc.) and chooses the optimum modulation matrices (step 68) and the signal 72 is modulated (step 74) and transmitted (step 278) to the selected active receivers 38.
11. In step 246, increase transmission epoch as t=t+1.
12. Go to 2 (step 220).

*NOTE: This feature should not be used together with adaptive algorithms in the early stages of channel characterization, especially if the feedback link has low error rate.

EXAMPLE

Assume that one of the algorithms discussed previously created a following set of entries in the prediction table P with parameters set to K=2 and Δ=1:
$P_{4,1}=7$, f=1; $P_{7,4}=3$, f=1; $P_{3,7}=1$, f=1; $P_{1,3}=2$, f=0.5 and $P_{1,3}=3$, f=0.5; $P_{2,1}=3$, f=1;

During the normal operation of the system, the indices fed back from the receiver 38 are as follows:
...73123....

However, during the transmission, the indices 7 and the second 3 were corrupted due to some additional interference or other reason and were changed to 8 and 4, respectively. This results in the string of indices:
...83124....

An error identification phase is also shown in FIG. 17. If there is no error detecting code in the feedback link and the adaptive training of the predictor is not on, the system will be able to identify the errors 28 by searching for the matching patterns in the prediction matrix P or dictionary D.

In this case, there is no valid entry $P_{3,8}$ in the matrix P (or equivalently, an phrase in D starting with 83), so that it is possible to assume that one of the indices 8 or 3 is erroneous. This situation will typically occur in the beginning of all index transmission or when one of the previous indices was predicted/recovered erroneously.

For the second error, the entry in $P_{2,1}$ is 3, with f=1, so that the algorithm can assume that the index 4 is erroneous.

Once the erroneous indices 28 were identified, the algorithm can use the regular prediction algorithm (see above) to recover the problem.

If the string was:
... 1 4 8 3 1 2 4 ....
the algorithm can see that the entry 8 should be equal to 7, as $P_{4,1}=7$, f=1 and entry 4, equal to 3, as $P_{2,1}=3$, f=1. This will result in the corrected string of indices as:
... 7 3 1 2 3 ....
which is identical to the original string.

Further possibilities for the error correction phase are shown in FIG. 18. The situation becomes more complicated if the predictor returns more than one possible entry for the erroneous index 28. If the received string was:
... 7 3 1 4 3 ....
the algorithm can see that the entry 4 is erroneous 28 since none of the predictor entries $P_{1,3}=2$, f=0.5 or $P_{1,3}=3$, f=0.5; contains 4. Now it has to be clarified which entry, 2 or 3, should be there instead.

The algorithm will now create a set of possible error patterns. If maximum 1 bit error and 3-bit indices are assumed, the possible error patterns are:
100, 010, 001

Those patterns are now added to the binary representation of index 4 and remaps the resulting binary representations to the index number. This may result in new set of possible indices as follows:
7, 8, 2

Now the algorithm compares this list with the predictor matrix entries and can establish that the most probable actual index is 2, since it exists in both the above list and the matrix entry $P_{1,3}=2$, f=0.5.

This will result in the corrected string of indices as:
... 7 3 1 2 3 ....
which is identical to the original string.

In the claims, the word "comprising" is used in its inclusive sense and does not exclude other elements being present. The indefinite article "a" before a claim feature does not exclude more than one of the feature being present. Each one of the individual features described here may be used in one or more embodiments and is not, by virtue only of being described here, to be construed as essential to all embodiments as defined by the claims. Immaterial modifications may be made to the embodiments described here without departing from what is covered by the claims.

What is claimed is:

1. A method of producing a set of information to be used for predicting feedback concerning channel state information in a multiple antenna communication system, the method comprising:
   obtaining feedback concerning channel states;
   measuring a frequency of patterns of the feedback; and
   recording information concerning the frequency of the patterns of the feedback, wherein the patterns are sequences of adjacent indices followed by a final index.

2. The method of claim 1 wherein the recorded information concerning the frequency of the patterns of feedback comprises at least a record of the most frequent final index following each of several sequences of adjacent indices, and the record is stored in a matrix.

3. The method of claim 1 wherein the recorded information concerning the frequency of the patterns of feedback comprises at least a record of the frequencies of one or more final indices following each of several sequences of adjacent indices, and the record is stored in a matrix.

4. The method of claim 1 wherein the recorded information concerning the frequency of the patterns of feedback comprises at least a record of a list of final indices following each of several sequences of adjacent indices, and the record is stored as a dictionary of phrases, each phrase comprising a record of a sequence of several adjacent indices followed by a final index.

5. The method of claim 4 wherein the phrases vary in length according to the length of the sequence that is required in order for the final index following the sequence to be unique in the actual or simulated set of feedback.

6. The method of claim 1, further comprising updating the set of information during the operation of the multiple antenna communication system, further comprising the steps of:
   receiving feedback concerning channel states; and
   updating the recorded information concerning the frequency of the patterns of feedback according to the feedback received.

7. The method of claim 6 wherein as new feedback is received, information concerning the frequency of patterns from older feedback, or from the actual or simulated set of feedback originally used to produce the set of information, is discarded.

8. The method of claim 1 wherein said feedback concerning channel states comprises at least one of an actual set of feedback or a simulated set of feedback.

9. A method of predicting channel state information in a multiple antenna communication system, comprising:
   producing a set of information to be used for predicting feedback concerning channel state information in the multiple antenna communication system by obtaining feedback concerning channel states, measuring a frequency of patterns of the feedback, and recording information concerning the frequency of the patterns of the feedback;
   receiving sequences of indices; and
   using the set of information, predicting a further index.

10. The method of claim 9 wherein codeword indices received from individual users are predicted.

11. The method of claim 9 wherein indices of modulation matrices chosen by a transmitter are predicted.

12. The method of claim 9, further comprising recovering from a feedback error in the multiple antenna communication system, wherein a received index representing information concerning a channel state has been determined to be erroneous, including:
   making one or more attempts to predict an index appropriate for the channel state; and
   choosing an index representing a channel state according to the one or more attempts as follows:
      in the case that an attempt to predict fails, choosing an index that has previously been used,
      in the case that there is a single predicted index, choosing the single predicted index, or
      in the case that there are more than one predicted indices, choosing a maximum number of bit errors to consider, and choosing a predicted index from the more than one predicted indices that could have resulted in the received index with a number of bit errors less than the maximum number of bit errors to consider, and if there is no predicted index that could have resulted in the received index with a number of bit errors less than the maximum number of bit errors to consider, choosing any one of the more than one predicted indices.

13. The method of claim 9, further comprising compensating for feedback error in a multiple input transmission system, including:
   receiving feedback concerning a channel state;
   determining whether a feedback error occurred using one or more of the methods of:
      using an error detecting code; or
      predicting the channel state and determining whether the feedback agrees with the prediction; and
   if a feedback error was detected, determining what the feedback would have been without the error.

14. The method of claim 13 wherein the channel state is predicted by receiving sequences of indices and, using a record of frequencies of patterns of actual or simulated feedback, predicting a further index.

15. The method of claim 13 wherein the channel state is predicted by:
   making one or more attempts to predict an index appropriate for the channel state; and
   choosing an index representing a channel state according to the one or more attempts as follows:
      in the case that an attempt to predict fails, choosing an index that has previously been used,
      in the case that there is a single predicted index, choosing the single predicted index, or
      in the case that there are more than one predicted indices, choosing a maximum number of bit errors to consider, and choosing a predicted index from the more than one predicted indices that could have resulted in the received index with a number of bit errors less than the maximum number of bit errors to consider, and if there is no predicted index that could have resulted in the received index with a number of bit errors less than the maximum number of bit errors to consider, choosing any one of the more than one predicted indices.

16. A method of producing a set of information to be used for predicting feedback concerning channel state information in a multiple antenna communication system, the method comprising:
   receiving a channel code index;
   obtaining feedback concerning channel states based on the received channel code index;
   measuring a frequency of patterns of the feedback; and
   recording information concerning the frequency of the patterns of the feedback, wherein the patterns are sequences of adjacent indices followed by a final index.

* * * * *